(12) United States Patent
Yokoyama et al.

(10) Patent No.: US 12,414,308 B2
(45) Date of Patent: Sep. 9, 2025

(54) SEMICONDUCTOR DEVICE AND METHOD OF MANUFACTURING SEMICONDUCTOR DEVICE

(71) Applicant: SONY SEMICONDUCTOR SOLUTIONS CORPORATION, Kanagawa (JP)

(72) Inventors: Takashi Yokoyama, Kanagawa (JP); Taku Umebayashi, Kanagawa (JP); Nobutoshi Fujii, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 40 days.

(21) Appl. No.: 16/480,750

(22) PCT Filed: Jan. 11, 2018

(86) PCT No.: PCT/JP2018/000408
§ 371 (c)(1),
(2) Date: Jul. 25, 2019

(87) PCT Pub. No.: WO2018/146984
PCT Pub. Date: Aug. 16, 2018

(65) Prior Publication Data
US 2019/0363130 A1    Nov. 28, 2019

(30) Foreign Application Priority Data
Feb. 7, 2017    (JP) .................. 2017-020626

(51) Int. Cl.
*H10B 61/00*    (2023.01)
*H01L 23/66*    (2006.01)
(Continued)

(52) U.S. Cl.
CPC ............. *H10B 61/22* (2023.02); *H01L 23/66* (2013.01); *H10F 39/024* (2025.01);
(Continued)

(58) Field of Classification Search
CPC ........ H10B 61/22; H10N 50/01; H10N 50/10; H10F 39/024; H01L 23/66
(Continued)

(56) References Cited

U.S. PATENT DOCUMENTS 5,400,039 A * 3/1995 Araki ...................... H01Q 1/32
343/700 MS
6,686,263 B1 * 2/2004 Lopatin ............... H01L 51/0021
438/257
(Continued)

FOREIGN PATENT DOCUMENTS

CN    104425439           3/2015
CN    104617915 A    *    5/2015
(Continued)

OTHER PUBLICATIONS

"Novell Colossal Magnetoresistive Thin Film Nonvolatile Resistance Random Access Memory (RRAM)," by Zhuang et al., pp. 193-196 pages of IEDM Technical Digest (2002) (Year: 2002).*
(Continued)

*Primary Examiner* — Nathan W Ha
(74) *Attorney, Agent, or Firm* — SHERIDAN ROSS P.C.

(57) ABSTRACT

A semiconductor device according to an embodiment of the present disclosure includes: a first substrate provided with an active element; and a second substrate laminated with the first substrate and electrically coupled to the first substrate, in which the second substrate is provided with a first transistor configuring a logic circuit on a first surface and with a non-volatile memory element on a second surface opposite to the first surface.

20 Claims, 15 Drawing Sheets

(51) Int. Cl.
  *H10F 39/00* (2025.01)
  *H10N 50/01* (2023.01)
  *H10N 50/10* (2023.01)
(52) U.S. Cl.
  CPC ............ *H10N 50/01* (2023.02); *H10N 50/10* (2023.02); *H01L 2223/6677* (2013.01)
(58) Field of Classification Search
  USPC ........................................................ 257/421
  See application file for complete search history.

(56) References Cited

U.S. PATENT DOCUMENTS

| | | | | |
|---|---|---|---|---|
| 2003/0031408 | A1* | 2/2003 | Ota | G02B 6/14 385/28 |
| 2004/0145026 | A1* | 7/2004 | Sun | G02B 6/30 257/459 |
| 2005/0052938 | A1* | 3/2005 | Horikoshi | B82Y 10/00 257/E27.005 |
| 2010/0276572 | A1* | 11/2010 | Iwabuchi | H04N 23/54 257/443 |
| 2013/0009321 | A1* | 1/2013 | Kagawa | H04N 5/369 438/455 |
| 2013/0235689 | A1* | 9/2013 | Koyama | H01L 27/1203 365/227 |
| 2014/0332749 | A1* | 11/2014 | Yokoyama | H01L 21/845 257/288 |
| 2015/0060967 | A1* | 3/2015 | Yokoyama | H01L 27/14612 257/295 |
| 2015/0061020 | A1* | 3/2015 | Yokoyama | H01L 29/785 438/666 |
| 2015/0097258 | A1* | 4/2015 | Shigetoshi | H01L 21/8232 257/432 |
| 2016/0204153 | A1 | 7/2016 | Tayanaka | |
| 2016/0260774 | A1 | 9/2016 | Umebayashi et al. | |
| 2016/0301890 | A1 | 10/2016 | Kurokawa | |
| 2017/0033062 | A1 | 2/2017 | Liu et al. | |
| 2017/0133425 | A1* | 5/2017 | Shigenami | H01L 25/04 |
| 2017/0141768 | A1* | 5/2017 | Yang | H03K 3/356104 |
| 2017/0150042 | A1* | 5/2017 | Suzuki | H04N 5/2258 |
| 2017/0230598 | A1 | 8/2017 | Takayanagi et al. | |
| 2019/0363130 | A1* | 11/2019 | Yokoyama | H01L 23/552 |

FOREIGN PATENT DOCUMENTS

| | | | |
|---|---|---|---|
| CN | 104617916 A | * | 5/2015 |
| JP | 2004-356537 | | 12/2004 |
| JP | 2007103640 A | | 4/2007 |
| JP | 2015-046477 | | 3/2015 |
| JP | 2015-065407 | | 4/2015 |
| JP | 2015-082564 | | 4/2015 |
| KR | 20080019652 A | | 3/2008 |
| TW | 200703516 | | 1/2007 |
| TW | 200709407 | | 3/2007 |
| WO | WO 2006/129762 | | 12/2006 |
| WO | WO 2016/009942 | | 1/2016 |

OTHER PUBLICATIONS

English Abstract of CN-104617916-A .. May 2015.*
English Abstract of CN-104617915-A .. May 2015.*
International Search Report prepared by the Japan Patent Office on Mar. 20, 2018, for International Application No. PCT/JP2018/000408.
Official Action for Taiwan Patent Application No. 107102886, dated Jun. 7, 2021, 17 pages.

* cited by examiner

SEMICONDUCTOR DEVICE AND METHOD OF MANUFACTURING SEMICONDUCTOR DEVICE

CROSS REFERENCE TO RELATED APPLICATIONS

This application is a national stage application under 35 U.S.C. 371 and claims the benefit of PCT Application No. PCT/JP2018/000408 having an international filing date of 11 Jan. 2018, which designated the United States, which PCT application claimed the benefit of Japanese Patent Application No. 2017-020626 filed 7 Feb. 2017, the entire disclosures of each of which are incorporated herein by reference.

TECHNICAL FIELD

The present disclosure relates to a semiconductor device including, for example, a non-volatile memory element using a magnetic material, and a method of manufacturing the semiconductor device.

BACKGROUND ART

An MTJ (Magnetic Tunnel Junction) element that is a non-volatile memory element using a magnetic material has low resistance to heat. This may possibly lead to degradation due to thermal budget during a wiring forming process. To solve this, for example, PTL 1 discloses a method of manufacturing a semiconductor device by forming the MTJ element on side of a back surface of a substrate after completion of the wiring forming process.

Incidentally, PTL 2 discloses a semiconductor device including an image sensor laminated on a logic circuit.

CITATION LIST

Patent Literature

PTL 1: Japanese Unexamined Patent Application Publication No. 2014-220376
PTL 2: Japanese Unexamined Patent Application Publication No. 2015-65407

SUMMARY OF THE INVENTION

Thus, a semiconductor device that includes an image sensor laminated on a substrate including an MTJ element may possibly lead to degradation of characteristics of the MTJ element due to thermal budget during a lamination process of the image sensor. Therefore, it is desired to develop a method of manufacturing a semiconductor device that allows for preventing the degradation of the characteristics of a non-volatile memory element such as the MTJ element.

It is desirable to provide a semiconductor device that allows for preventing degradation of characteristics of a non-volatile memory element and a method of manufacturing the semiconductor device.

A semiconductor device according to an embodiment of the present disclosure includes: a first substrate provided with an active element; and a second substrate laminated with the first substrate and electrically coupled to the first substrate, in which the second substrate is provided with a first transistor configuring a logic circuit on a first surface and with a non-volatile memory element on a second surface opposite to the first surface.

A method of manufacturing a semiconductor device according to an embodiment of the present disclosure includes: forming an active element on a first substrate; forming a transistor configuring a logic circuit on a first surface of a second substrate; electrically coupling the first substrate and the second substrate together: and forming a non-volatile memory element on a second surface of the second substrate opposite to the first surface.

In the semiconductor device according to an embodiment of the present disclosure and the method of manufacturing the semiconductor device according to an embodiment of the present disclosure, the first transistor configuring the logic circuit is provided on the first surface of the second substrate, and the non-volatile memory element is provided on the second surface opposite to the first surface. This makes it possible to provide the non-volatile memory element at a desired timing and thus to reduce thermal budget applied to the non-volatile memory element.

Accordance to the semiconductor device according to an embodiment of the present disclosure and the method of manufacturing the semiconductor device according to an embodiment of the present disclosure, the first transistor configuring the logic circuit is provided on the first surface and the non-volatile memory element is provided on the second surface opposite to the first surface, thus making it possible to provide the non-volatile memory element at a desired timing. This makes it possible to reduce the thermal budget applied to the non-volatile memory element and thus to prevent degradation of characteristics of the non-volatile memory element.

It is to be noted that effects of the present disclosure is not limited to those described above, and may be any of the effects described below.

MODES FOR CARRYING OUT THE INVENTION

Figure 1:
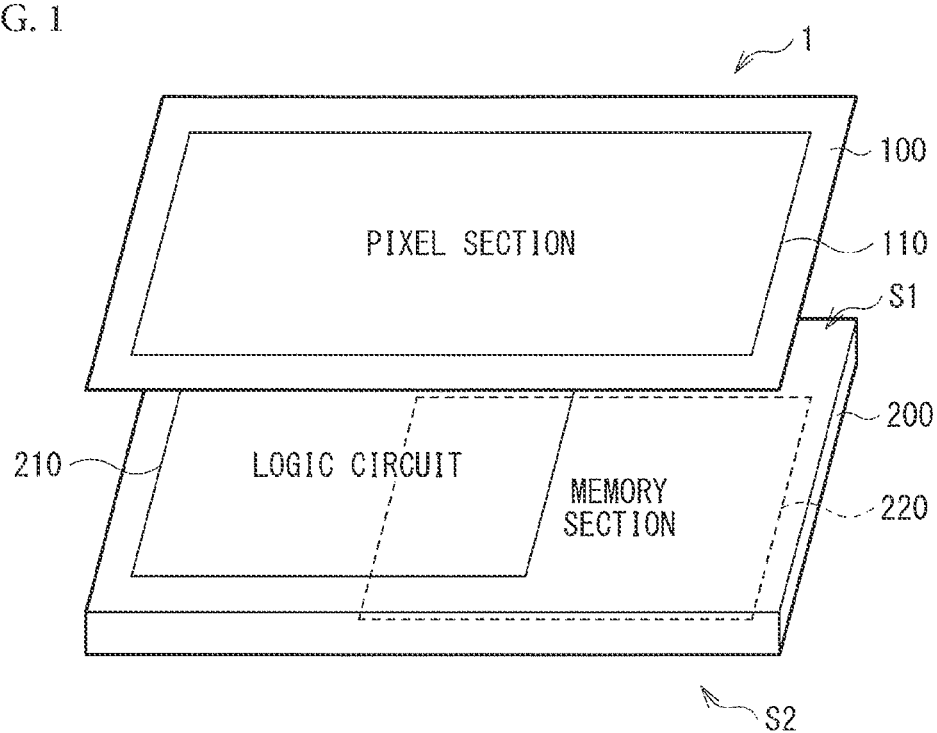
FIG. 1 is a schematic view of a semiconductor device according to a first embodiment of the present disclosure.

In the following, embodiments of the present disclosure are described in detail with reference to the drawings. The following description is directed to a specific example of the present disclosure, and the present disclosure is not limited to the following embodiments. Moreover, the present disclosure is not limited to positions, dimensions, dimension ratios, and other factors of components illustrated in the drawings. It is to be noted that the description is given in the following order.

1. First Embodiment
   (An example semiconductor device including a first substrate and a second substrate laminated together, the first substrate having an image sensor and the second substrate including a logic circuit on a surface S1 and a non-volatile memory element on a surface S2)
   1-1. Configuration of Semiconductor Device
   1-2. Method of Manufacturing Semiconductor Device
   1-3. Workings and Effects
2. Second Embodiment (An example semiconductor device including three substrates laminated together)
3. Modification Example 1 (An example in which a leading electrode is further provided on the surface S2 of the second substrate)
4. Third Embodiment (An example semiconductor device provided with a circuit having a communication function on the first substrate)
5. Modification Example 2 (An example in which an antenna is further provided in addition to the circuit having the communication function)

First Embodiment (1-1 Configuration of Semiconductor Device)

FIG. 1 illustrates a schematic configuration of a semiconductor device (semiconductor device 1) according to a first embodiment of the present disclosure. The semiconductor device 1 includes a first substrate 100 and a second substrate 200 electrically coupled to each other and laminated together. The semiconductor device 1 is, for example, a laminated image sensor, in which the first substrate 100 is provided with a pixel section 110 and the second substrate 200 is provided with a logic circuit 210 and a memory section 220. In the present embodiment, the logic circuit 210 is provided on a surface (first surface, surface S1), of the second substrate, facing the first substrate 100, and the memory section 220 is provided on a surface (second surface, surface S2), of the second substrate 200, opposite to the surface facing the first substrate 100.

Unit pixels are two-dimensionally arranged on the pixel section 110 of the first substrate 100, in which there are disposed, for example, a backside illumination imaging element (imaging element 10, see FIG. 2), a transfer transistor that transfers charges obtained by photoelectric conversion of the imaging element 10 to an FD (floating diffusion) section, a reset transistor that resets an electric potential of the FD section, an amplifying transistor that outputs a signal corresponding to the electric potential of the FD section, and the like. The imaging element 10 corresponds to a specific example of an active element of the present disclosure.

As described above, the second substrate 200 is provided with the logic circuit 210 such as a control circuit that controls operation of the imaging element 10 on side of the surface S1, and a non-volatile memory element (storage element 40) that configures the memory section 220 on side of the surface S2. It is to be noted that, on the surface S1 side, in addition to the logic circuit, there may be disposed, for example, a circuit having an image processing function, an ADC (Analog digital converter) circuit that converts an analog signal outputted from the unit pixel provided on the pixel section into a digital signal and outputs the digital signal, and the like.

Figure 2:
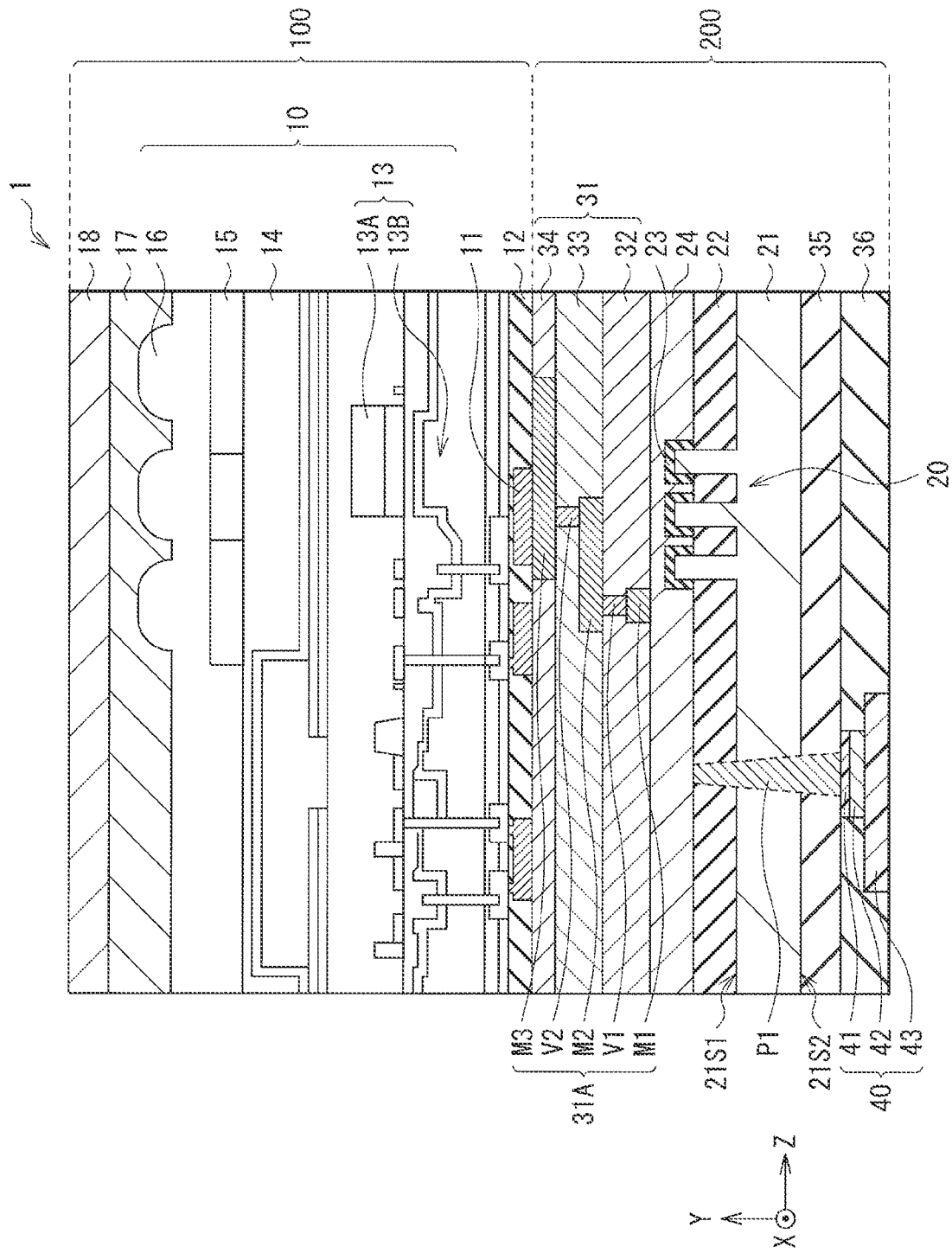
FIG. 2 is a cross sectional view of a specific configuration of the semiconductor device illustrated in FIG. 1.

FIG. 2 illustrates an example of a specific cross-sectional configuration of the semiconductor device 1 illustrated in FIG. 1. In the semiconductor device 1, the first substrate 100 is provided with the imaging element 10, as described above. The imaging element 10 has a configuration in which, for example, a planarization layer 14, a color filter 15, and a microlens 16 are laminated in this order on a semiconductor substrate 13 having a photodiode 13A and a transistor 13B embedded therein. The first substrate 100 includes a protective layer 17 on the microlens 16 of the imaging element 10, and a glass substrate 18 is disposed on the protective layer 17. Moreover, the first substrate 100 includes an electrically-conductive film 11 including Cu, for example, in the lowermost layer (a surface facing the second substrate 200), and an insulating layer 12 is provided around the electrically-conductive film 11.

The second substrate 200 includes a transistor 20 that configures the logic circuit 210 such as the control circuit on side of a surface 21S1 of a semiconductor substrate 21 (the surface S1 side of the second substrate 200 in FIG. 1), for example, that is on side of the surface facing the first substrate 100. The transistor 20 is a transistor having a three-dimensional structure, for example, and is a Fin-FET transistor, for example.

Figure 3:
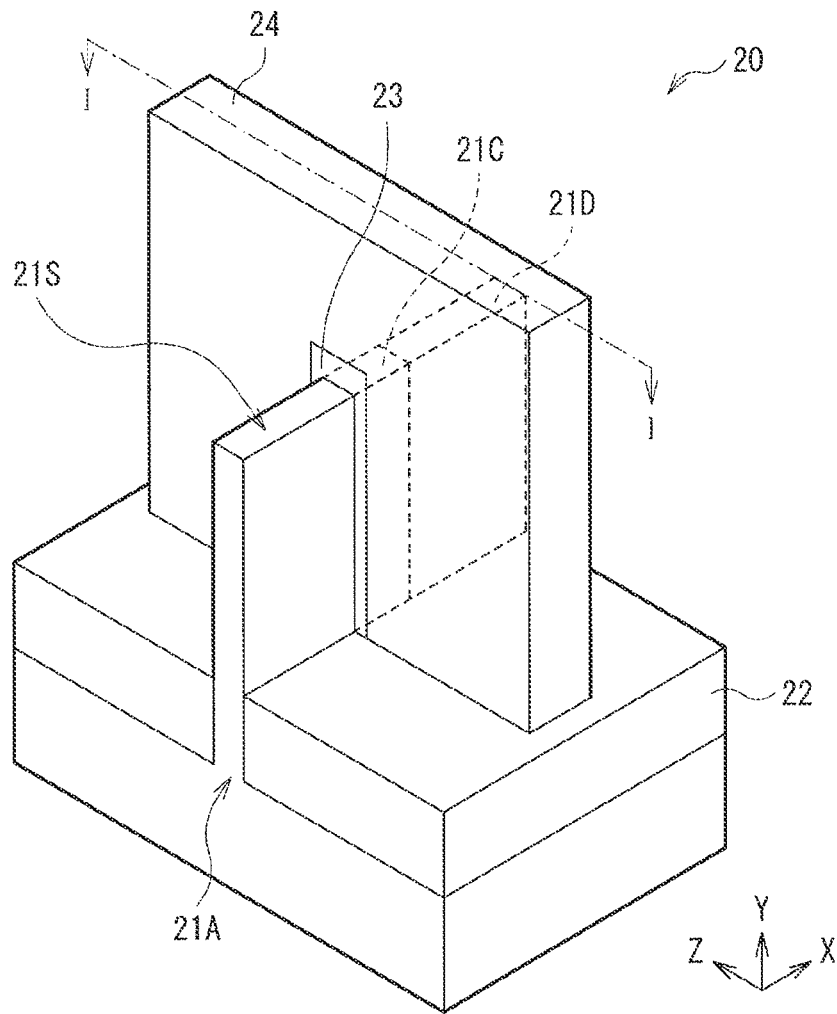
FIG. 3 is an explanatory perspective view of a transistor provided on a second substrate of the semiconductor device illustrated in FIG. 2.

FIG. 3 perspectively illustrates a configuration of the Fin-FET transistor 20. The transistor 20 is configured by a fin 21A, a gate insulating film 23, and a gate electrode 24. The fin 21A includes Si, for example, and has a source region 21S and a drain region 21D. The fin 21A is in a tabular form, and a plurality of fins 21A stands on the semiconductor substrate 21 that includes, for example, Si. Specifically, the plurality of fins 21A each extends in an X-axis direction, for example, and is arranged in parallel in a Z-axis direction. Provided on the semiconductor substrate 21 is an insulating layer 22 configured by $SiO_2$, for example. A portion of the fin 21A is embedded in the insulating layer 22. The gate insulating film 23 is provided to cover a side surface and an upper surface of the fin 21A exposed from the insulating layer 22, and is configured by, for example, HfSiO, HfSiON, TaO, TaON, or the like. The gate electrode 24 so extends in the Z direction that crosses the extending direction of the fin 21A (X direction) as to straddle the fin 21A. The fin 21A is provided with a channel region 21C at a portion crossing the gate electrode 24, and the source region 21S and the drain region 21D are provided with the channel region 21C interposed therebetween. It is to be noted that the cross-sectional structure of the transistor 20 illustrated in FIG. 2 illustrates a cross section taken along a line I-I in FIG. 3.

The transistor 20 may be a Tri-Gate transistor, a nano-wire (Nano-Wire) transistor, an FD-SOI transistor, and a T-FET, other than the Fin-FET transistor described above. An inorganic semiconductor such as germanium (Ge) or a compound semiconductor such as a III-V semiconductor and a II-VI semiconductor, other than silicon (Si), may be used, as a semiconductor material, for the above-described transistors including the Fin-FET transistor. Specific examples of the II-VI semiconductor include InGaAs, InGaSb, SiGe, GaAsSb, InAs, InSb, InGanZnO (IGZO), $MoS_2$, $WS_2$, Boron Nitride, and Silicane Germanene. Another example thereof includes a graphene transistor using graphene. Moreover, the transistor 20 may be a transistor that employs a high dielectric constant film/metal gate (High-K/Metal Gate) technology. Alternatively, the transistor 20 may be a so-called Si planar transistor (see FIG. 8).

A multilayer wiring forming section 31 is provided on the transistor 20. The multilayer wiring forming section 31 includes, for example, an interlayer insulating film 32, an interlayer insulating film 33, and an interlayer insulating film 34 laminated in this order from side closer to the transistor 20. A wiring line 31A is provided for each of the interlayer insulating film 32, the interlayer insulating film 33, and the interlayer insulating film 34. The wiring line 31A is configured by a metal film M1, a metal film M2, and a metal film M3 provided for the interlayer insulating films 32, 33, and 34, respectively, and by a via V1 and a via V2 coupling them together. The via VI penetrates the interlayer insulating film 32 to couple the metal film M1 and the metal film M2 together. The via V2 penetrates the interlayer insulating film 33 to couple the metal film M2 and the metal film M3 together. The metal film M1, the metal film M2, the metal film M3, the via V1, and the via V2 include, for example, copper (Cu). The metal film M3 is provided at the uppermost layer of the second substrate 200 (the surface facing the first substrate 100). The first substrate 100 and the second substrate 200 are electrically coupled together by joining the electrically-conductive film 11 provided at the lowermost layer of the first substrate 100 and the metal film M3. It is to be noted that the configuration of the multilayer wiring forming section 31 illustrated in FIG. 2 is exemplary, and this is not limitative.

The storage element 40 configuring the memory section 220 is provided on side of a surface 21S2 of the semiconductor substrate 21 (the surface S2 side of the second substrate 200 in FIG. 1). The storage element 40 is, for example, a magnetic tunnel junction (Magnetic Tunnel Junction; MTJ) element. The storage element 40 has a configuration in which, for example, an electrically-conductive film 41, a storage section 42, and an electrically-conductive film 43 (which also serves as a bit line BL) are laminated in order via an insulating layer 35. It is to be noted that the electrically-conductive film 41 is set as a lower electrode and the electrically-conductive film 43 is set as an upper electrode. The electrically-conductive film 41 is coupled to the source region 21S or the drain region 21D of the transistor 20 via a contact plug P1, for example. The contact plug P1 has a truncated pyramid shape or a truncated cone shape, for example, with its occupied area increasing from the surface Si side toward the surface S2 side (i.e., from a lower end toward an upper end) in this example. An insulating layer 36 is provided around the storage element 40. The insulating layer 35 is configured by, for example, a High-K (high dielectric constant) film that allows for low-temperature formation, i.e., hafnium (Hf) oxide, aluminum oxide ($Al_2O_3$), ruthenium (Ru) oxide, tantalum (Ta) oxide, an oxide containing aluminum (Al), Ta, ruthenium (Ru), or Hf, and Si, a nitride containing Al, Ru, Ta, or Hf, and Si, an oxynitride containing Al, Ru, Ta. or Hf. and Si, or the like. The insulating layer 36 is configured by, for example, $SiO_2$ or a low-K (low dielectric constant) film.

The storage section 42 is preferably a spin-injection magnetization inverting storage element (STT-MTJ; Spin Transfer Torque-Magnetic Tunnel Junctions) that stores information by inverting an orientation of magnetization of a storage layer (storage layer 42D, see FIG. 4) described later by spin injection. The STT-MTJ is viewed as a promising non-volatile memory that replaces a volatile memory because the STT-MTJ allows for fast read/write.

The electrically-conductive film 41 and the electrically-conductive film 43 are each configured by, for example, a film of metal such as Cu, Ti, W, and Ru. The electrically-conductive film 41 and the electrically-conductive film 43 are each preferably configured by a metal film other than a constituent material of an underlayer 42A or a cap layer 42E described later, i.e., mainly include a Cu film, an Al film, or a W film. Moreover, the electrically-conductive film 41 and the electrically-conductive film 43 may also be configured as a metal film (single layer film) or a laminated film containing titanium (Ti), TiN (titanium nitride), Ta, TaN, (tantalum nitride), tungsten (W), Cu, Al, or the like.

Figure 4:
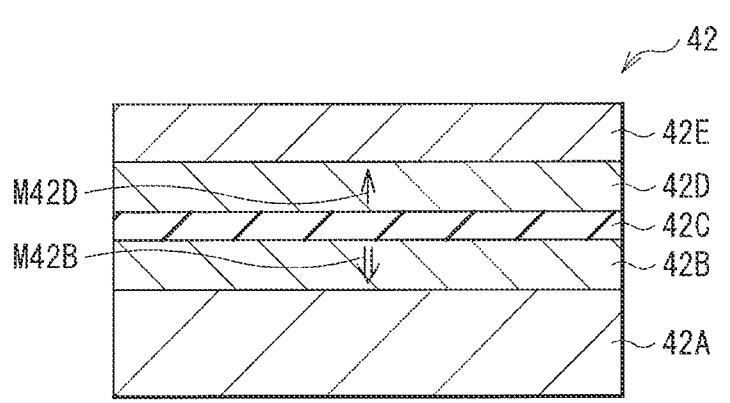
FIG. 4 is a cross sectional view of a configuration of a storage section of a storage element provided in the second substrate of the semiconductor device illustrated in FIG. 2.

FIG. 4 illustrates an example of a configuration of the storage section 42. The storage section 42 has a configuration in which, for example, the underlayer 42A, a magnetization pinned layer 42B, an insulating layer 42C, the storage layer 42D, and the cap layer 42E are laminated in this order from side closer to the electrically-conductive film 41. Namely, the storage element 40 has a bottom pin structure including the magnetization pinned layer 42B, the insulating layer 42C, and the storage layer 42D in this order upward from the bottom in a lamination direction. In the storage element 40, information is stored by changing the orientation of magnetization M42D of the storage layer 42D having a uniaxial anisotropy, and "0" or "1" of the information is defined by a relative angle (parallel or antiparallel) between the magnetization M42D of the storage layer 42D and magnetization M42B of the magnetization pinned layer 42B.

The underlayer 42A and the cap layer 42E are each configured by a metal film (single layer film) or a laminated film containing Ta, Ru, or the like.

The magnetization pinned layer 42B is a reference layer serving as a reference of stored information (magnetization direction) in the storage layer 42D, and configured by a ferromagnetic body having a magnetic moment with a direction of the magnetization M42B being pinned in a direction perpendicular to a film surface. The magnetization pinned layer 42B is configured by, for example, cobalt (Co)-iron (Fe)-boron (B).

It is not desirable that the direction of the magnetization M42B of the magnetization pinned layer 42B be changed by writing and reading; however, the direction may not necessarily be pinned in a specific direction. One reason for this is that it is sufficient to have less freedom of motion in the direction of the magnetization M42B of the magnetization pinned layer 42B than the direction of the magnetization M42D of the storage layer 42D. For example, it is sufficient for the magnetization pinned layer 42B to have higher coercive force, a larger magnetic film thickness, or a larger magnetic damping constant than the storage layer 42D. To pin the direction of the magnetization M42B, for example, an antiferromagnetic body such as PtMn and IrMn may be provided in contact with the magnetization pinned layer 42B. Alternatively, the direction of the magnetization M42B may be indirectly pinned by magnetically coupling a magnetic body in contact with such an antiferromagnetic body to the magnetization pinned layer 42B via a non-magnetic body such as Ru.

The insulating layer 42C is an intermediate layer serving as a tunnel barrier layer (tunnel insulating layer), and is configured by, for example, $Al_2O_3$ or magnesium oxide (MgO). Among others, the insulating layer 42C is preferably configured by MgO. This makes it possible to increase a magnetic resistance change rate (MR ratio), to improve efficiency of spin injection, and to reduce current density for inverting the orientation of the magnetization M42D of the storage layer 42D.

The storage layer 42D is configured by the ferromagnetic body having a magnetic moment that allows the direction of the magnetization M42D to freely change to the direction perpendicular to the film surface. The storage layer 42D is configured by, for example, Co—Fe—B.

It is to be noted that, although the present embodiment has been described hereinabove with reference to the MTJ element as the storage element 40, any other nonvolatile element may be used as well. Examples of the nonvolatile element other than the MTJ element include a variable resistance element such as a ReRAM and a FLASH.

Moreover, the surface Si of the second substrate 200 may be provided with a programmable circuit in addition to the control circuit. This makes it possible to change and automate operation of an imaging apparatus as needed.

(1-2. Method of Manufacturing Semiconductor Device)

The semiconductor device 1 of the present embodiment may be manufactured in the following manner, for example. FIGS. 5A to 5E illustrate an example of the method of manufacturing the semiconductor device 1 in a process order.

Figure 5A:
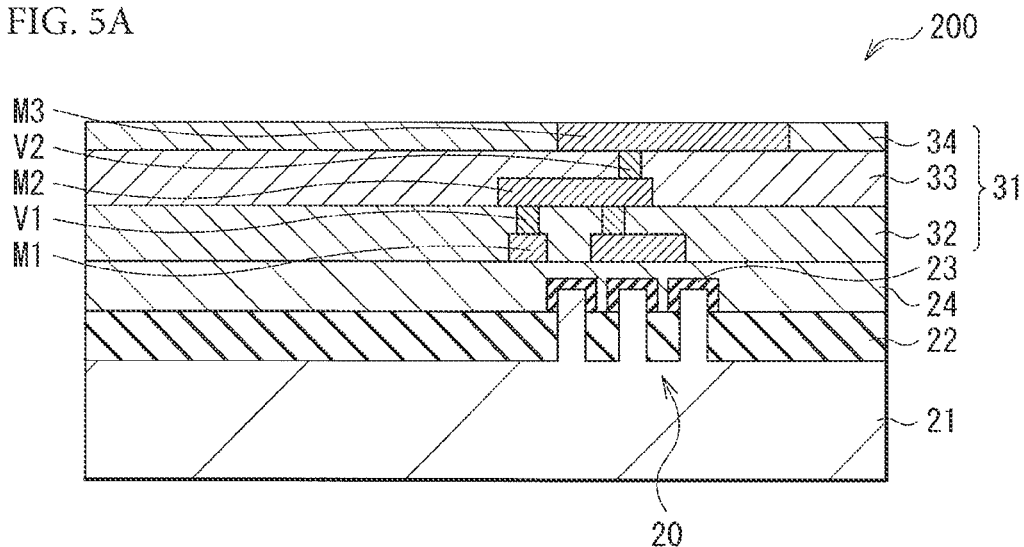
FIG. 5A is a cross sectional view that describes a method of manufacturing the semiconductor device illustrated in FIG. 2.
Figure 5B:
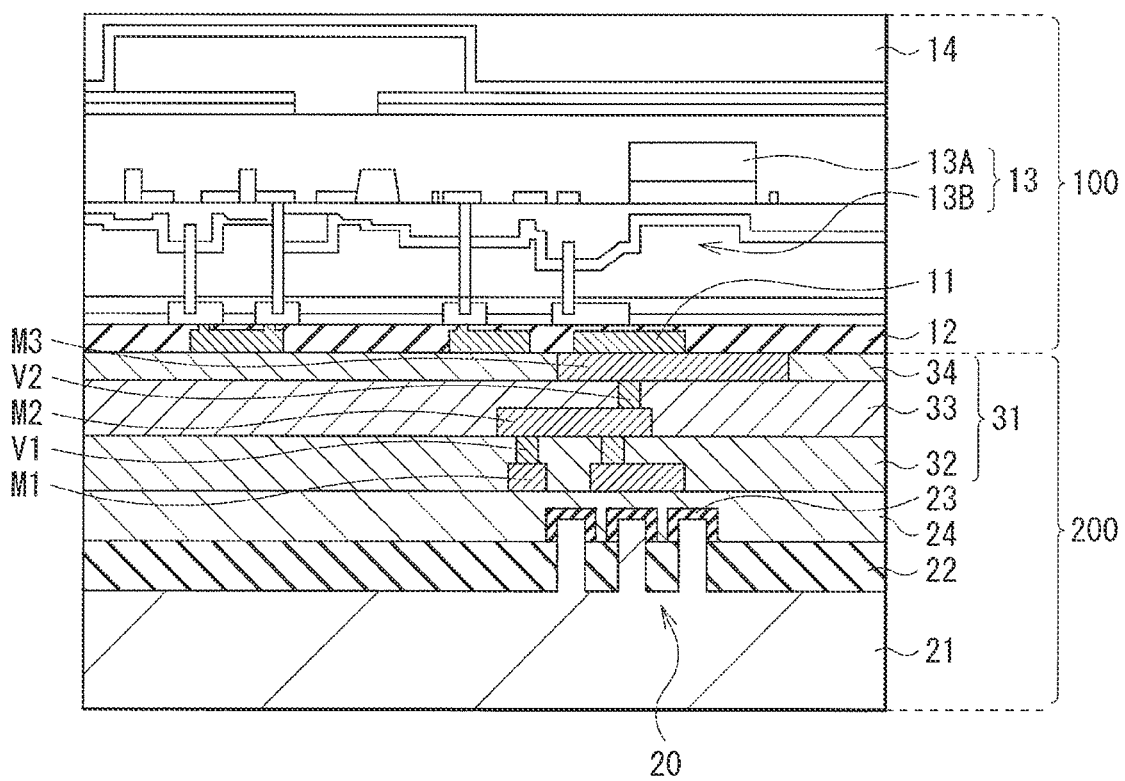
FIG. 5B is a cross sectional view of a process step that follows FIG. 5A.
Figure 5C:
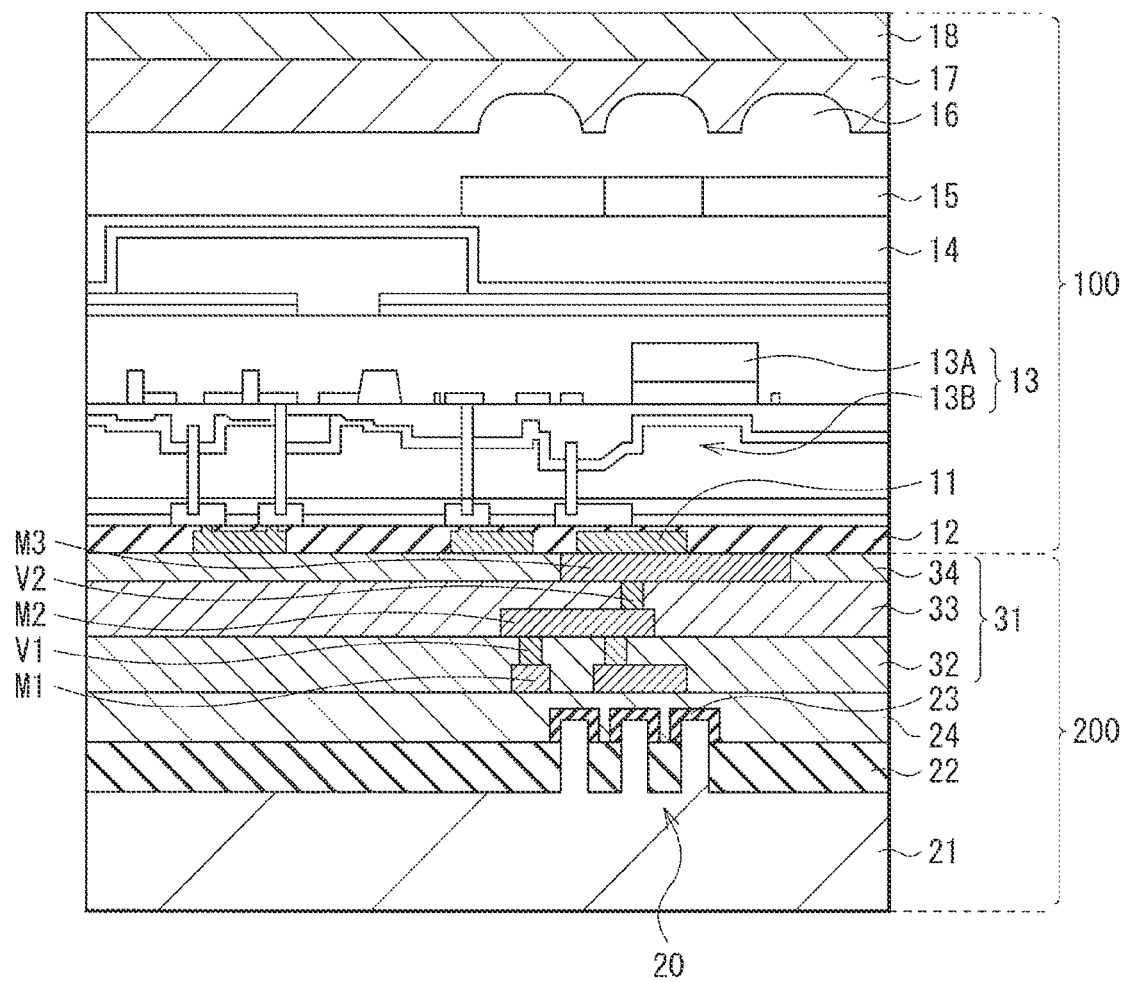
FIG. 5C is a cross sectional view of a process step that follows FIG. 5B.

First, as illustrated in FIG. 5A, the transistor 20 and the multilayer wiring forming section 31 that configure the logic circuit are formed in the second substrate 200. Subsequently, the first substrate 100 provided with the imaging element 10 formed separately and the second substrate 200 are laminated by joining the electrically-conductive film 11 provided at the lowermost layer of the first substrate 100 and the metal film M3 provided at the uppermost layer of the second substrate 200 to each other. Next, as illustrated in FIG. 5C, the color filter 15, the microlens 16, and the protective layer 17 are formed on the planarization layer 14 of the imaging element 10 of the first substrate 100, and thereafter the glass substrate 18 is adhered onto the protective layer 17.

Figure 5D:
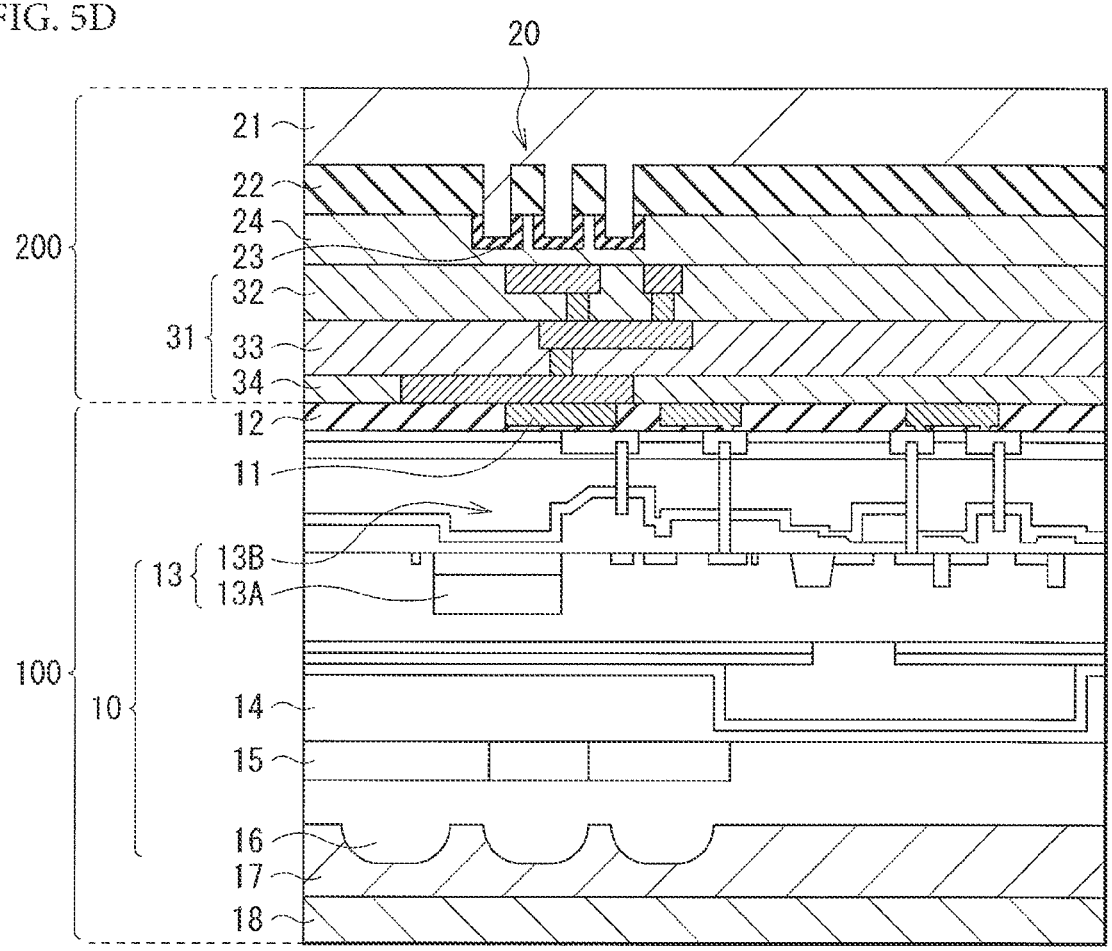
FIG. 5D is a cross sectional view of a process step that follows FIG. 5C.
Figure 5E:
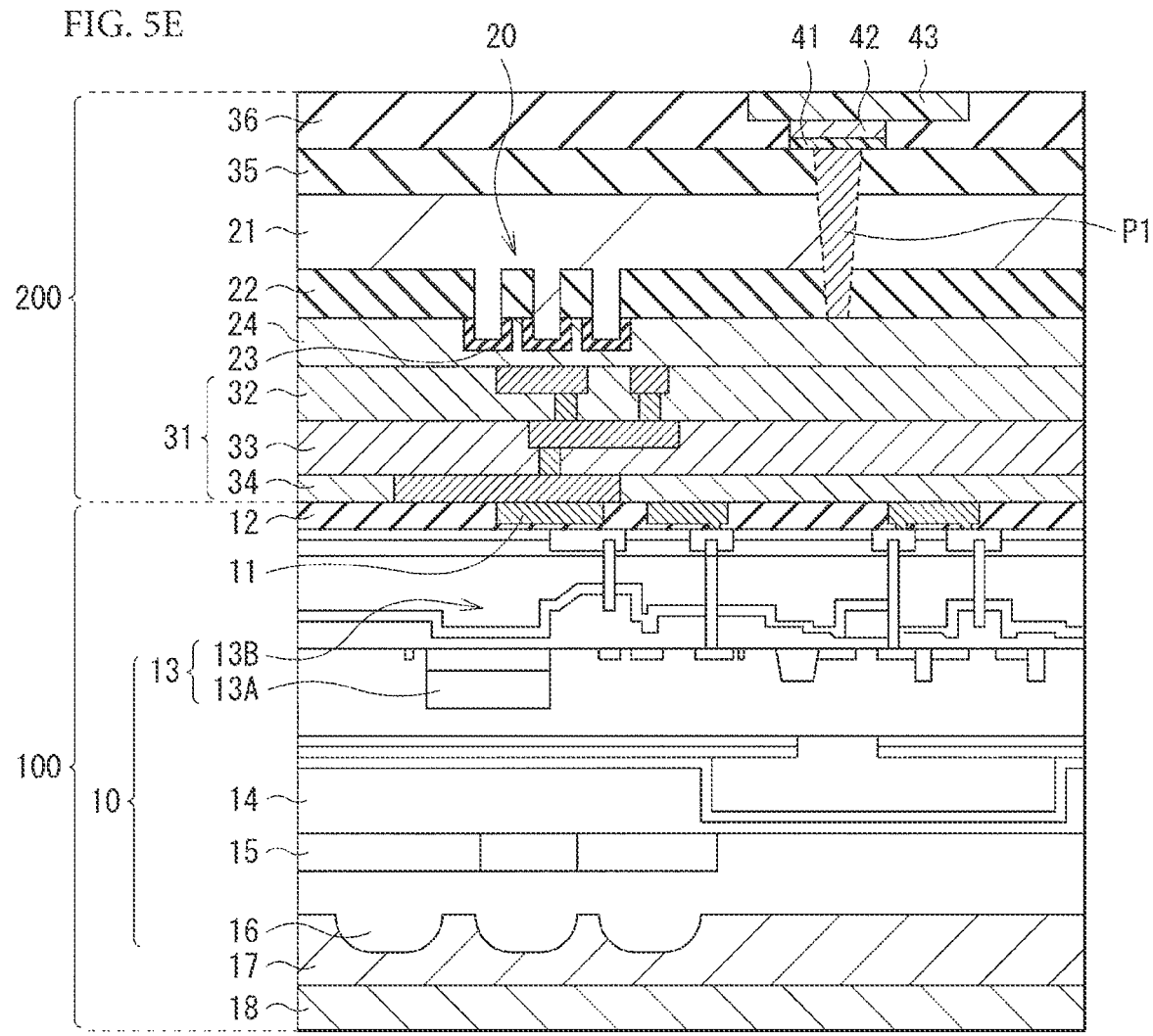
FIG. 5E is a cross sectional view of a process step that follows FIG. 5D.

Subsequently, as illustrated in FIG. 5D, the entire device is inversed using the glass substrate 18 as a supporting substrate, and the semiconductor substrate 21 of the second substrate 200 is polished to make the device thinner. Next, as illustrated in FIG. 5E, the contact plug P1 and the storage element 40 are formed. The contact plug P1 couples the source region 21S of the transistor 20 and the storage element 40 to each other via the insulating layer 35, for example. This allows the semiconductor device 1 illustrated in FIG. 2 to be complete.

(1-3. Workings and Effects)

The MTJ element using the magnetic material is viewed as a promising non-volatile memory that replaces the volatile memory. However, as described above, the MTJ element has low resistance to heat, and this may possibly lead to degradation of the element characteristics due to the thermal budget during the wiring forming process.

It is possible to avoid the degradation of the element characteristics due to the thermal budget by forming the MTJ element after finishing the wiring process. However, with the semiconductor device including the active element such as the image sensor laminated on the logic circuit, the MR ratio of the MTF element may possibly be degraded by the thermal budget during the lamination process of the image sensor.

Meanwhile, in the semiconductor device 1 of the present embodiment, the imaging element 10 (pixel section 110) is provided in the first substrate 100, and the logic circuit 210 including the control circuit of the imaging element 10 and the storage element 40 (memory section 230) are provided in the second substrate 200. In particular, the transistor 20 configuring the logic circuit 210 is provided on the surface Si side of the second substrate 200, and the storage element 40 is provided on the surface S2 side of the second substrate 200. This makes it possible to form the storage element 40 at a desired timing, i.e., specifically after forming the transistor 20 and the imaging element 10 and joining the first substrate 100 and the second substrate together. Thus, it is possible to reduce the thermal budget to the storage element 40.

As described above, in the present embodiment, the imaging element 10 is provided in the first substrate 100, the transistor 20 configuring the logic circuit 210 is provided on the surface S1 side of the second substrate 200, and the storage element 40 is provided on the surface S2 side opposite to the surface S2. This makes it possible to form the storage element 40 after the process of forming a wiring line including the transistor 20 and a process of forming the imaging element 10, which makes it possible to reduce the thermal budget to the storage element 40 and to prevent the degradation of the element characteristics.

It is to be noted that, although the present embodiment has been described with reference to the image sensor (imaging element 10) as an example of the active element, this is not limitative; for example, various sensor functions such as a temperature sensor, a gravity sensor, and a position sensor may be included.

Next, second and third embodiments and Modification Examples 1 and 2 are described. It is to be noted that components corresponding to those in the semiconductor device 1 of the above-described first embodiment are denoted with the same reference numerals.

2. Second Embodiment

Figure 6:
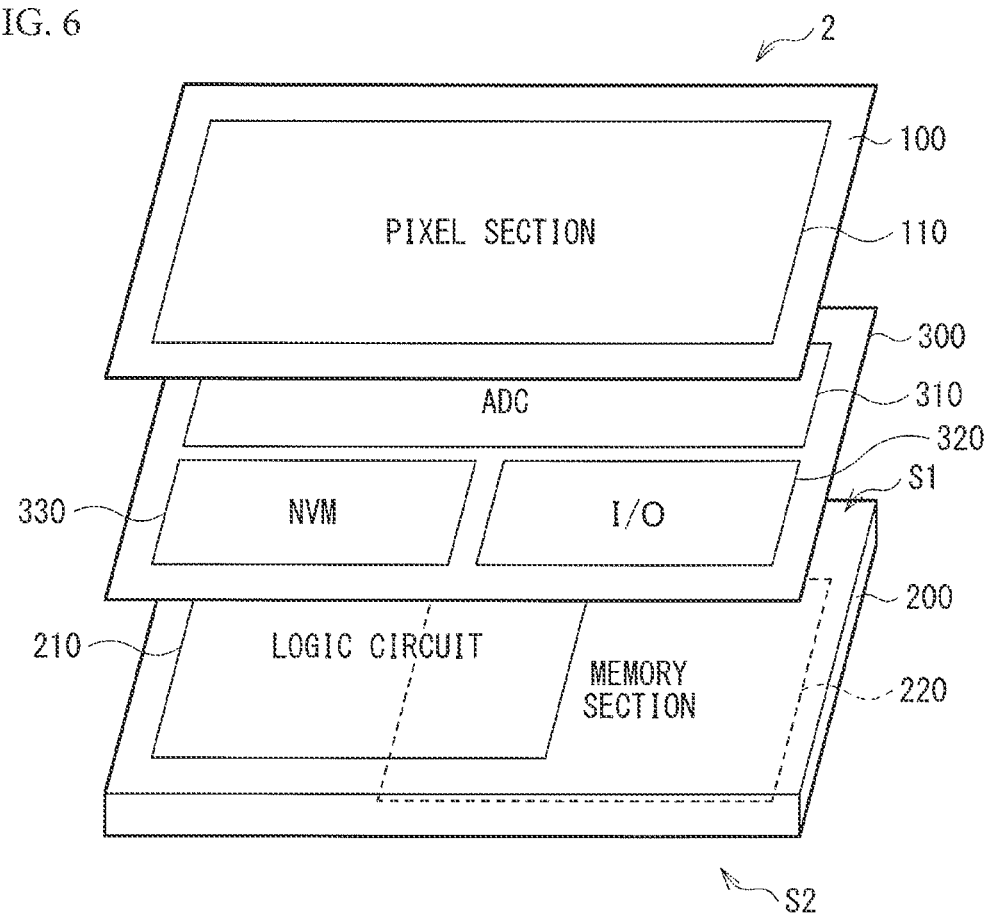
FIG. 6 is a schematic view of a semiconductor device according to a second embodiment of the present disclosure.

FIG. 6 illustrates a schematic configuration of a semiconductor device (semiconductor device 2) according to a second embodiment of the present disclosure. The semiconductor device 2 is a laminated image sensor, and includes the first substrate 100, the second substrate 200, and a third substrate 300 electrically coupled to one another and laminated together. The semiconductor device 2 has a configuration in which the third substrate 300 is disposed between the first substrate 100 and the second substrate 200. In the semiconductor device 2 of the present embodiment, similarly to the first embodiment, the imaging element 10 is provided in the first substrate 100, and the storage element 40 is provided on the surface S2 side of the second substrate 200; among the circuits configuring the image sensor, circuits having mutually different supply voltages are provided separately on the surface S side of the second substrate 200 and on the third substrate 300. Specifically, among the circuits provided in the semiconductor device 2, a circuit having the lowest supply voltage is provided on the surface Si of the second substrate 200, and a circuit having the highest supply voltage is provided on the third substrate 300.

Here, the circuit having the lowest supply voltage means a circuit that includes a transistor having the lowest drive voltage, and is the logic circuit 210, for example. The transistor having the lowest drive voltage means a transistor manufactured using a state-of-the-art process, and is, for example, the Fin-FET transistor illustrated in FIG. 3, the Tri-Gate transistor, the nano-wire (Nano-Wire) transistor, the FD-SOI transistor, and the T-FET, or the transistor that employs the high dielectric constant film/metal gate (High-K/Metal Gate). Moreover, a functional block that allows for high-speed signal processing may be provided on the surface S1 of the second substrate 200.

The circuit having the highest supply voltage means a circuit that includes a transistor having the highest drive voltage; for example, an analog circuit such as an ADC 310, an input/output (Input/Output (I/O)) circuit 320, a circuit for controlling operation of the imaging element 10, and the like are provided. Moreover, for example, in a case where the circuit configuring the memory section 220 includes the transistor having the highest drive voltage, a circuit part (Non-volatile memory (NVM)) circuit 330) including a transistor that is driven at the highest voltage may be provided on the third substrate 300. Here, the transistor having the highest drive voltage means a transistor manufactured using the existing manufacturing process, and is, for example, the Si planar transistor.

Figure 7:
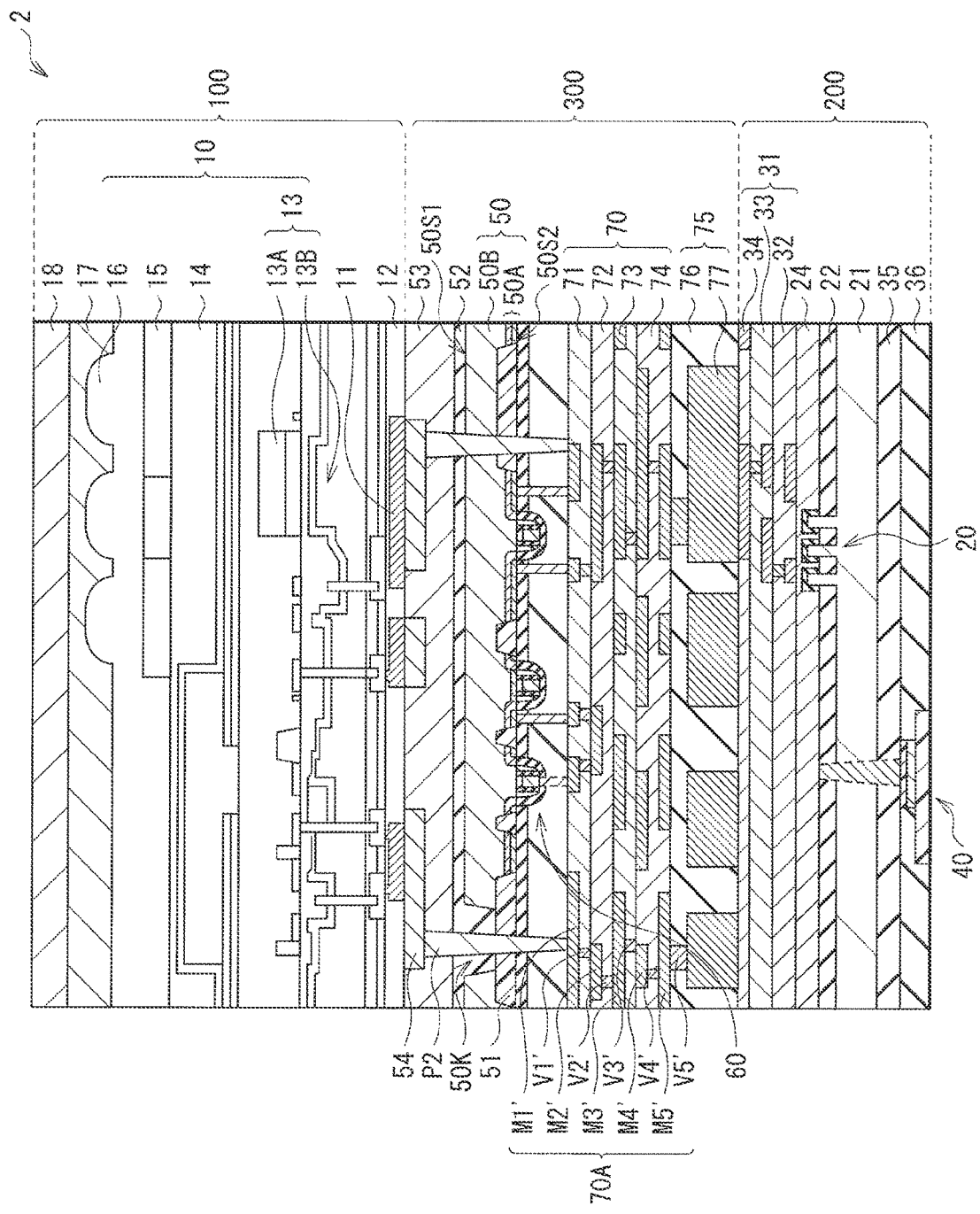
FIG. 7 is a cross sectional view of a specific configuration of the semiconductor device illustrated in FIG. 6.

FIG. 7 illustrates an example of a specific cross-sectional configuration of the semiconductor device 2 illustrated in FIG. 6. The semiconductor device 2 includes the first substrate 100 described in the first embodiment. In the present embodiment, the second substrate 200 is provided with the logic circuit 210 including the Fin-FET transistor 20, for example, and the third substrate 300 is provided with the ADC 310 including a transistor (transistor 60) having an Si planar structure, the I/O circuit 320, and the NVM 330.

The third substrate 300 includes, for example, a multi-layer wiring forming section 70 and a surface wiring forming section 75 laminated in this order on a surface 50S2 of a semiconductor substrate 50. The Si planar transistor 60 is provided near the surface 50S2 of the semiconductor substrate 50, and an electrically-conductive film 54 is provided on the surface Si side of the semiconductor substrate 50 with insulating layers 52 and 53 interposed therebetween. It is to be noted that, although FIG. 7 illustrates an example where three transistors 60 are provided, the number of the transistors 60 provided on the semiconductor substrate 50 is not particularly limited. The number may be one, or two or more. Moreover, a transistor other than the Si planar transistor may be provided.

The semiconductor substrate 50 is provided with an element separation film 51 formed by, for example, STI (Shallow Trench Isolation). The element separation film 51 is an insulating film including a silicon oxide film ($SiO_2$), for example, and one surface thereof is exposed to the surface 50S2 of the semiconductor substrate 50.

The semiconductor substrate 50 has a laminated structure of a first semiconductor layer 50A (hereinbelow, referred to as a semiconductor layer 50A) and a second semiconductor layer 50B (hereinbelow, referred to as a semiconductor layer 50B). The semiconductor layer 50A has a configuration in which a channel region configuring a portion of the transistor 60 and a pair of diffusion layers 62 (described later) are formed on monocrystalline silicon, for example. The semiconductor layer 50B includes the monocrystalline silicon, for example, and has a polarity different from that of the semiconductor layer 50A. The semiconductor layer 50B is provided to cover the semiconductor layer 50A and the element separation film 51.

A surface (a surface on side facing the first substrate 100) of the semiconductor layer 50B is covered with the insulating layer 52. The semiconductor layer 50B has an opening 50K. The opening 50K is filled with the insulating layer 52. Furthermore, a contact plug P2 extending to penetrate a coupling part of the insulating layer 52 and the element separation film 51, for example, is provided at the opening 50K part. The contact plug P2 is formed by using a material mainly including, for example, low-resistance metal such as Cu, W, or Al. Moreover, it is preferable that a barrier metal layer including Ti or Ta alone or an alloy thereof be provided around the low-resistance metal. A periphery of the contact plug P2 is covered with the element separation film 51 and the insulating layer 52, and is electrically separated from the semiconductor substrate 50 (the semiconductor layer 50A and the semiconductor layer 50B).

Figure 8:
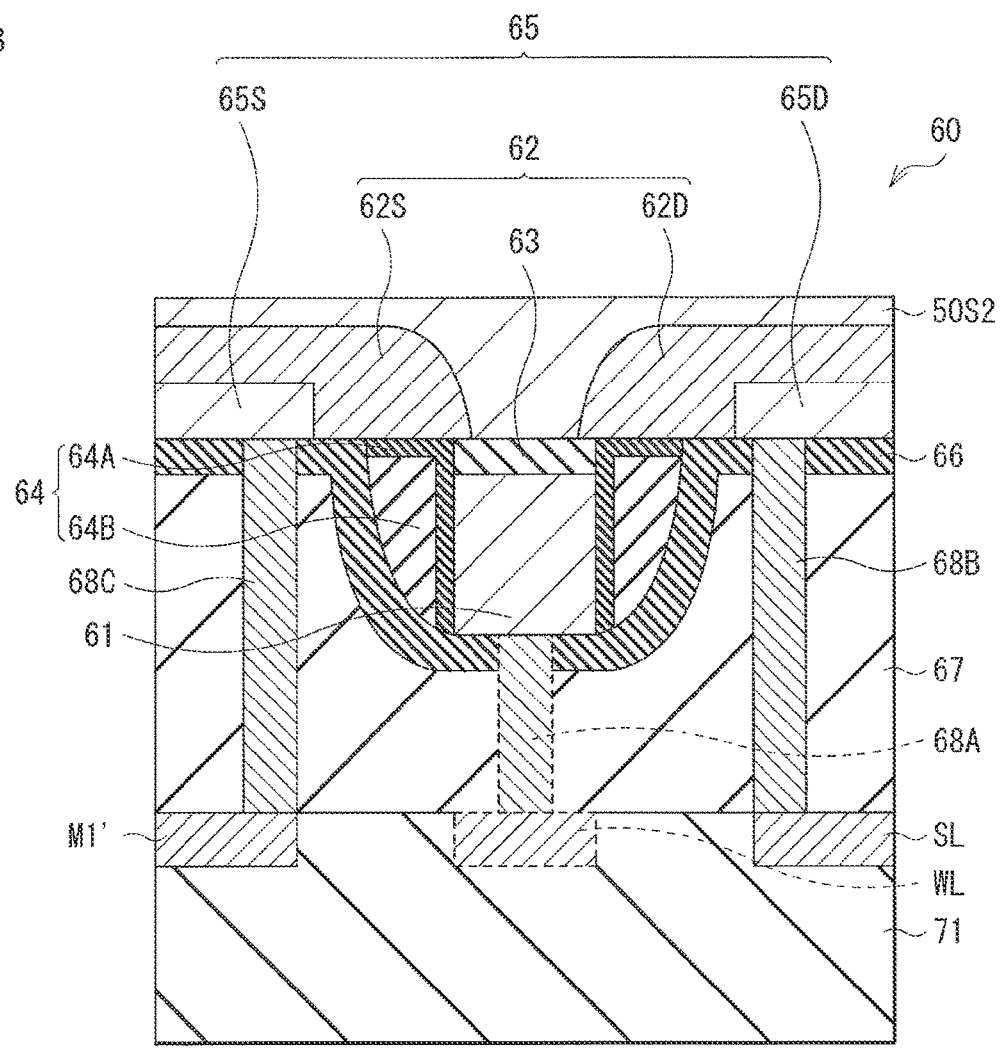
FIG. 8 is a cross sectional view that describes a transistor included in a third substrate of the semiconductor device illustrated in FIG. 7.

The transistor 60 is the Si planar transistor, and includes, for example, a gate electrode 61 and the pair of diffusion layers 62 (62S and 62D) serving as a source region and a drain region, as illustrated in FIG. 8. Moreover, the transistor 60 provided on the semiconductor substrate 50 is covered with an interlayer insulating film 66 and is embedded in an interlayer insulating film 67.

The gate electrode 61 is provided on the surface 50S2 of the semiconductor substrate 50. However, a gate insulating film 63 including a silicon oxide film or the like is provided between the gate electrode 61 and the semiconductor substrate 50. It is to be noted that the thickness of the gate insulating film 63 is larger than that of the transistor having the three-dimensional structure such as the Fin-FET described above. Provided on a side surface of the gate electrode 61 is a side wall 64 including a laminate film of a silicon oxide film 64A and a silicon nitride film 64B, for example.

The pair of diffusion layers 62 include silicon in which impurities are diffused, for example, and configure the semiconductor layer 50A. Specifically, the pair of diffusion layers 62 include a diffusion layer 62S corresponding to the source region and a diffusion layer 62D corresponding to the drain region, and are disposed with the channel region interposed therebetween. The channel region is facing the gate electrode 61 in the semiconductor layer 50A. Portions of the diffusion layers 62 (62S, 62D) are provided with silicide regions 65 (65S, 65D) including, for example, metal silicide such as nickel silicide (NiSi) or cobalt silicide (CoSi). The silicide regions 65 reduces contact resistance between each of connections 68A to 68C described later and the diffusion layers 62. The silicide region 65 has one surface thereof that is exposed to the surface 50S2 of the semiconductor substrate 50, whereas an opposite surface thereof is covered with the semiconductor layer 50B. Moreover, the thickness of each of the diffusion layers 62 and the silicide region 55 is smaller than that of the element separation film 51.

The interlayer insulating film 67 is provided with the connections 68A to 68C penetrating the interlayer insulating film 66 along with the interlayer insulating film 67. The silicide region 65D of the diffusion layer 62D serving as the drain region and the silicide region 65S of the diffusion layer 62S serving as the source region are coupled to a metal film M1' of a wiring line 70A described later via the connection 68B and the connection 68C, respectively. The contact plug P2 penetrates the interlayer insulating films 66 and 67, and contacts, at a lower end thereof, the metal film M1' configuring a selection line SL, for example. Thus, the contact plug P2 extends to penetrate all of the insulating layer 52, the element separation film 51, the interlayer insulating film 66, and the interlayer insulating film 67.

The multilayer wiring forming section 70 includes, for example, an interlayer insulating film 71, an interlayer insulating film 72, an interlayer insulating film 73, and an interlayer insulating film 74 laminated in order from side closer to the transistor 60. The wiring line 70A is provided for each of the interlayer insulating film 71, the interlayer insulating film 72, the interlayer insulating film 73, and the interlayer insulating film 7. The wiring line 70A is configured by the metal film M1', a metal film M2', a metal film M3', a metal film M4', and a metal film M5, as well as vias V1', V2', V3', V4', and V5' that couple them together. Here, the metal film M1', the metal film M2', the metal film M3', and the metal film M4' and the metal film M5 are respectively embedded in the interlayer insulating film 71, the interlayer insulating film 72, the interlayer insulating film 73, and the interlayer insulating film 74. Moreover, the metal film M1' and the metal film M2' are coupled by the via V1' that penetrates the interlayer insulating film 71. Similarly, the metal film M2' and the metal film M3' are coupled by the via V2' penetrating the interlayer insulating film 72. The metal film 3' and the metal film M4' are coupled by the via V3' penetrating the interlayer insulating film 73. The metal film 4' and the metal film M5' are coupled by the via V4' penetrating the interlayer insulating film 74. As described above, the wiring line 70A is coupled to the diffusion layers 62 serving as the drain region and the source region of the transistor 60, respectively, via the connection 68B and the connection 68C in contact with the metal film M1'. It is to be noted that the configuration of the multilayer wiring forming section 70 illustrated in FIG. 7 is exemplary, and this is not limitative.

Provided on the multilayer wiring forming section 70 is the surface wiring forming section 75 to be joined to the second substrate 200. In the surface wiring forming section 75, a metal film 77 including Cu, for example, is embedded in a surface of an insulating layer 76, and the surface of the metal film 77 is exposed to the insulating layer 76. The second substrate 200 and the third substrate 300 are electrically coupled by joining the metal film 77 and the metal film M3 of the second substrate 200 together. The metal film 77 is coupled to the metal film M5' of the multilayer wiring forming section 70 via the via V5' penetrating the insulating layer 76.

Provided on a surface 50S1 of the semiconductor substrate 50 is the insulating layer 52. The insulating layer 52 is configured by a High-K film allowing for low-temperature formation, for example. The insulating layer 53 is laminated on the insulating layer 52. The insulating layer 53 is configured by a film of a material (Low-K) having a specific dielectric constant lower than that of $SiO_2$, for example. Examples of the High-K film allowing for low-temperature formation include Hf oxide, $Al_2O_3$, Ru oxide, Ta oxide, an oxide containing Al, Ru. Ta. or Hf, and Si, a nitride containing Al, Ru, Ta, or Hf, and Si, an oxynitride containing Al., Ru, Ta, or Hf. and Si, and the like. The electrically-conductive film 54 is provided on first substrate 100 side of the insulating layer 53, and a surface of the electrically-conductive film 54 is exposed. The electrically-conductive film 54 is in contact with an upper end of the contact plug P2, and is joined to the electrically-conductive film 11 on the opposite surface. The electrically-conductive film 11 is provided at the lowermost layer of the first substrate 100. This allows the first substrate 100 and the third substrate 300 to be electrically coupled to each other.

As described above, in the semiconductor device 2 according to the present embodiment, circuits having different supply voltages, among a plurality of circuits configuring the imaging apparatus, are separately provided on separate substrates (the second substrate 200 and the third substrate 300). Specifically, a circuit including a transistor having the lowest drive voltage, as with the logic circuit 210, is provided on the surface SI of the second substrate 20X), and a circuit including a transistor having the highest drive voltage is provided on the third substrate 300.

This achieves an effect of making it possible to reduce the size of the semiconductor device, in addition to the effects of the above-described first embodiment. Moreover, providing the circuits having different supply voltages on separate substrates allows the transistor (the transistor 20 in this example) using the state-of-the-art process, for example, as described in the above-described first embodiment, for example, and the transistor (the transistor 60 in this example) using the existing manufacturing process to be provided on different substrates. This simplifies the manufacturing process, thus achieving effects of making it possible to reduce manufacturing cost and to improve manufacturing yield.

3. Modification Example 1

Figure 9:
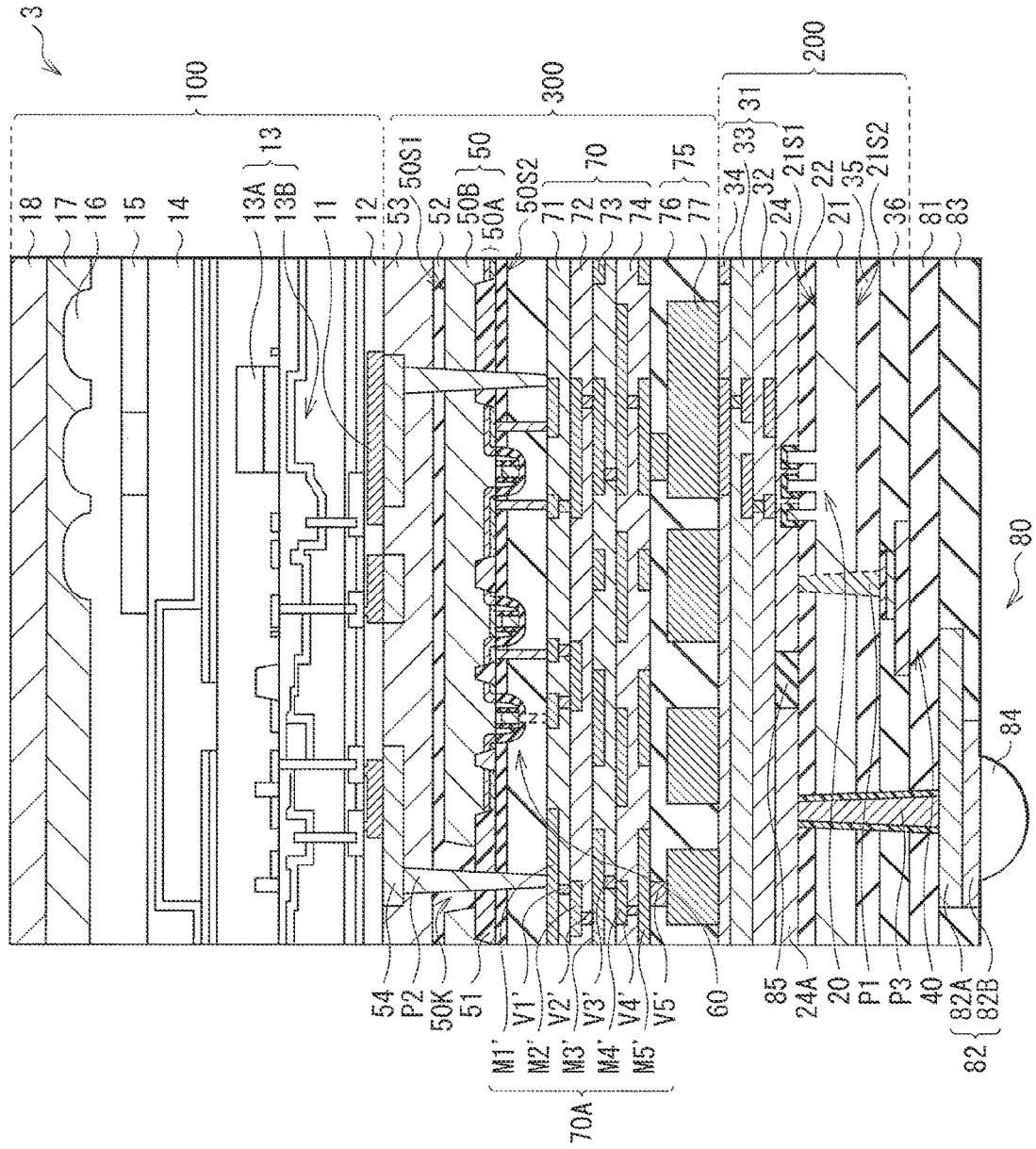
FIG. 9 is a cross sectional view of a semiconductor device according to Modification Example 1 of the present disclosure.

FIG. 9 illustrates an example of a specific cross-sectional configuration of a semiconductor device (semiconductor device 3) according to a modification example (Modification Example 1) of the second embodiment of the present disclosure. The present modification example is different from the above-described second embodiment in that a leading electrode 80 is provided on the surface S2 side of the second substrate 200.

The leading electrode 80 is configured by an electrically-conductive film 82 and a bump 84. The electrically-conductive film 82 is provided on a back surface (surface 21S2) of the semiconductor substrate 21 with insulating layers 35 and 36 and an insulating layer 81 interposed therebetween. The insulating layer 81 is configured by, for example, an $SiO_2$ film. An insulating layer 83 configured by the $SiO_2$ film, for example is provided around the electrically-conductive film 82. The electrically-conductive film 82 has a configuration in which, for example, an electrically-conductive film 82A including Cu and an electrically-conductive film 82B including Al are laminated in this order. The leading electrode 80 is electrically coupled to a wiring line 24A via a contact plug P3. The contact plug P3 penetrates the semiconductor substrate 21 and the insulating layers 22, 35, 36, and 81, for example. The wiring line 24A is separated from the gate electrode 24 by an insulating film 85, for example. It is to be noted that a periphery of the contact plug P3 is preferably covered with the insulating film, as illustrated in FIG. 9.

This makes it possible to configure an electrode outlet port anywhere even when the storage element 40 is provided on the surface S2 side of the second substrate 200.

It is to be noted that the leading electrode 80 is desirably formed at a temperature for forming the storage element 40 or lower because the leading electrode 80 is formed after forming the storage element 40. Moreover, the leading electrode 80 is allowed to be formed by exposing the metal film to be the electrode not only on side of the surface 21S1 of the semiconductor substrate 21 but also on a side surface of the second substrate 200, for example.

4. Third Embodiment

Figure 10:
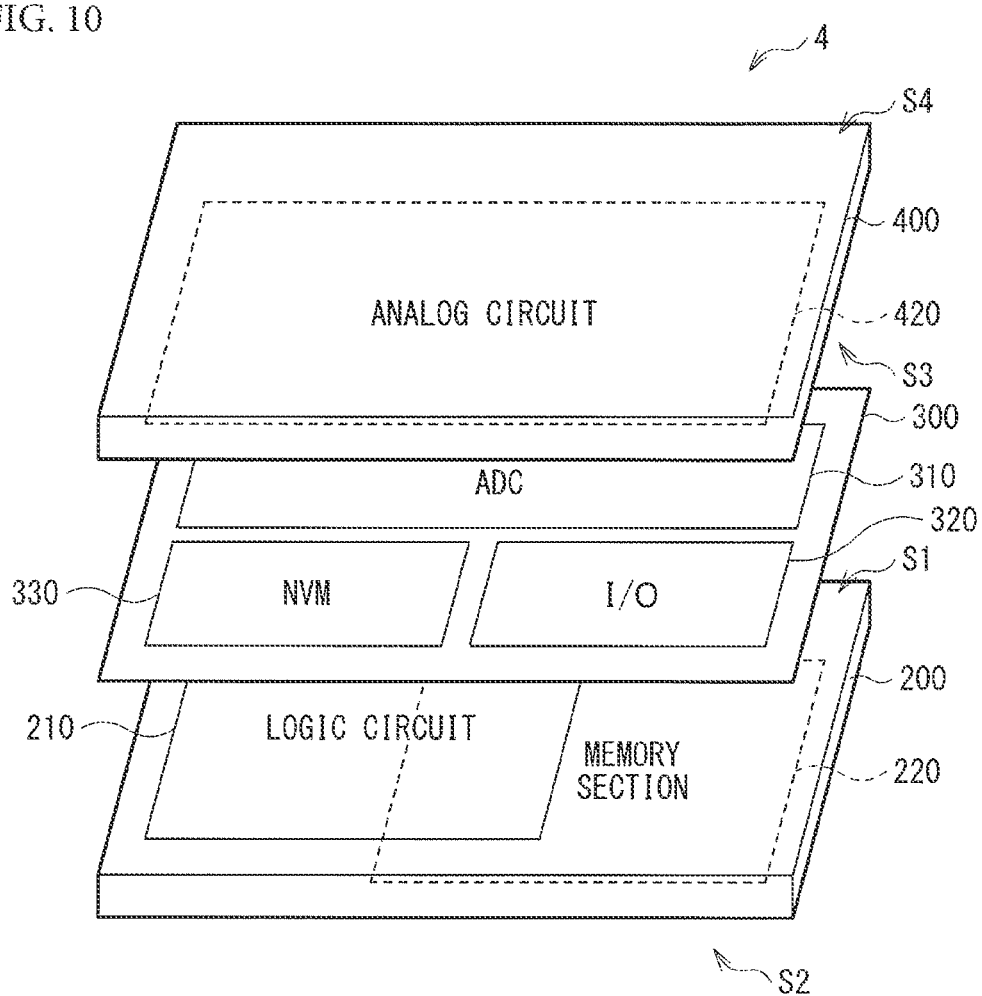
FIG. 10 is a schematic view of a semiconductor device according to a third embodiment of the present disclosure.

FIG. 10 illustrates a schematic configuration of a semiconductor device (semiconductor device 4) according to the third embodiment of the present disclosure. The semiconductor device 4 is mounted with, as another example of the active element, a platform for communication applied to various frequency bands ranging from a near field to a far field, for example. A first substrate 400 includes an analog circuit 420 configuring the communication platform on side of a surface (surface S3), of the first substrate 400, facing the third substrate 300, for example. The second substrate 200 and the third substrate 300 each have a configuration similar to that of the above-described second embodiment.

As illustrated in FIG. 10, the first substrate 400 includes the analog circuit 420 configuring the communication platform on the surface S3 side facing the third substrate 300. Specific examples of the analog circuit 420 include, for example, an RF front-end section including a transmit-receive switch and a power amplifier, and an RF-IC section including a low-noise amplifier and a transmit-receive mixer.

Although the first substrate 400 generally uses a silicon (Si) substrate as a core substrate, as described in the above-described first embodiment, there are cases in which a compound semiconductor substrate is partially used. For example, there are cases in which, for example, the above-described RF front-end section and RF-IC section are provided at a gallium nitride (GaN) substrate.

Figure 11:
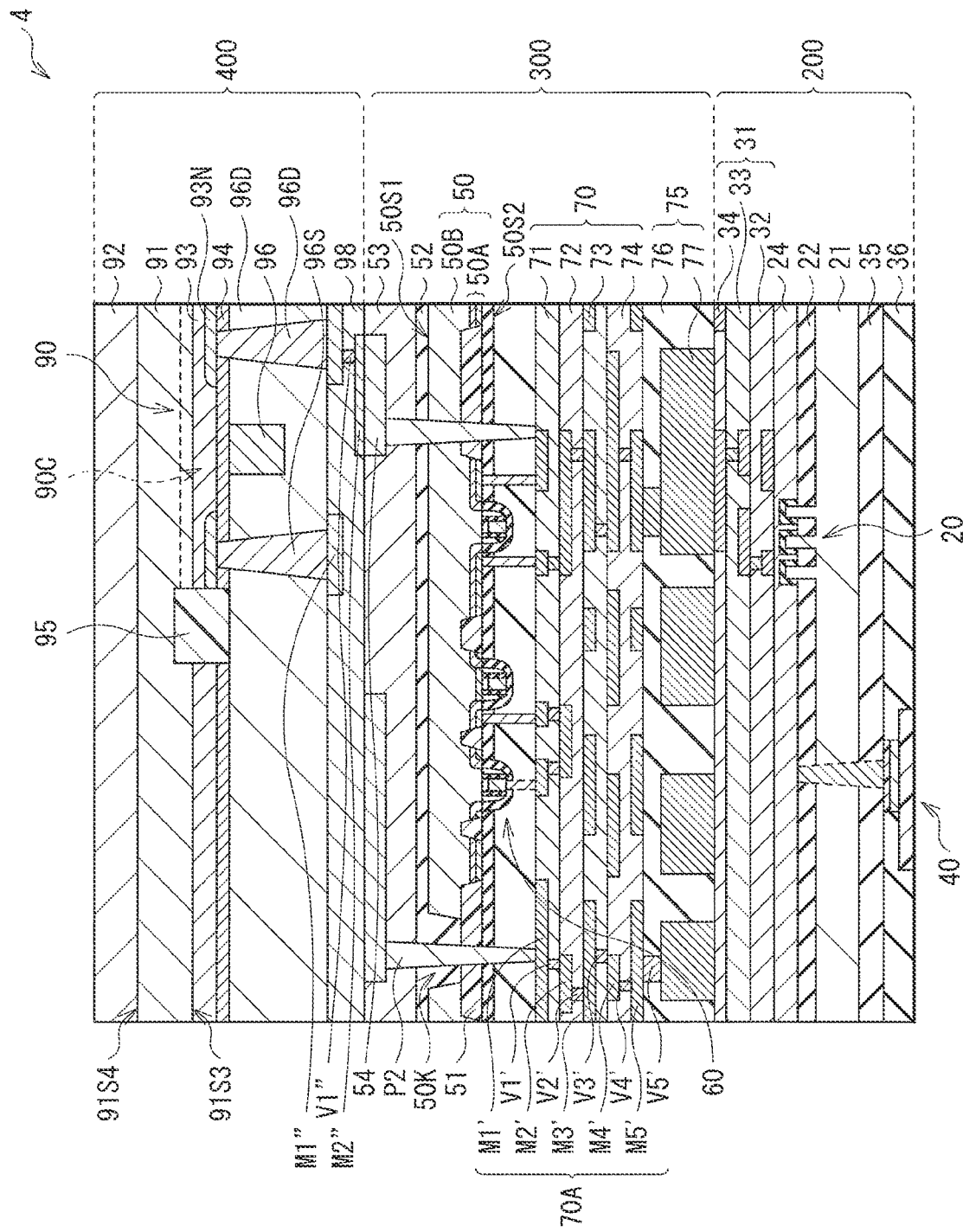
FIG. 11 is a cross sectional view of a specific configuration of the semiconductor device illustrated in FIG. 10.

FIG. 11 illustrates an example of a specific cross-sectional configuration of the semiconductor device 4 illustrated in FIG. 10. The present embodiment is described with reference to a case of using a GaN substrate 91 as the semiconductor substrate in the first substrate 400.

The first substrate 400 is provided with a transistor 90 on a surface 91S3 of the GaN substrate 91, for example. The transistor 90 is a high electron mobility transistor (High Electron Mobility Transistor; HEMT), for example. The HEMT is a transistor that controls two-dimensional electron gas (channel region 90C) formed on a heterojunction interface including heterogenous semiconductor by means of a field effect. On the GaN substrate 91, for example, an AlGaN layer 93 (or AlInN layer) is provided, which forms an AlGaN/GaN heterostructure. On the AlGaN layer 93, a gate electrode 96 is provided with a gate insulating film 94 interposed therebetween. Moreover, on the AlGaN layer 93, a source electrode 96S and a drain electrode 96D are provided with the gate electrode 96 interposed therebetween. The AlGaN layers 93 in contact with the source electrode 96S and the drain electrode 96D are each provided with an n-type region 93N. An element separation film 95 is provided adjacent to the transistor 90. An interlayer insulating film 97 is provided around the gate electrode 96, the source electrode 96S, and the drain electrode 96D. Provided on the interlayer insulating film 97 is a multilayer wiring forming section including a metal film M1" and a metal film M2" laminated in this order from side closer to the transistor 90. The metal film M1" and the metal film M2" are embedded in an interlayer insulating layer 98, and the metal film M1" and the metal film M2" are coupled by a via V1" penetrating the interlayer insulating layer 98. The first substrate 400 and the third substrate 300 are electrically coupled by joining the metal film M2" and the electrically-conductive film 54 together. Provided on the other surface (surface 91S4) of the GaN substrate 91 is an Si substrate 92 as a base substrate.

In this manner, in the present embodiment, the first substrate 400 including a platform for communication is laminated on the second substrate 200 provided with the storage element 40. Moreover, the storage element 40 is provided on the surface S2 side of the second substrate 200. This allows the storage element 40 to be formed after the wiring forming process of the second substrate 200 and the process of forming the platform for communication, thus making it possible to reduce the thermal budget to the storage element 40 and to prevent degradation of the element characteristics.

That is, regardless of the type of the active element, the circuit including the storage element 40 along with the transistor 20 and the active element (e.g., the imaging element 10 and the platform for communication) are provided on separate substrates (the first substrate 100 (, 400) and the second substrate 200). Furthermore, the circuit including the transistor 20 and the storage element 40 are provided on different surfaces (the surface Si and the surface S2) of the substrate (second substrate 200). This makes it possible to provide the semiconductor device with reduced element characteristics of the storage element 40.

It is to be noted that, although the present embodiment has been described with reference to an example in which three substrates (the first substrate 400, the second substrate 200, and the third substrate 300) are laminated similarly to the second embodiment, the embodiment is also applicable to the semiconductor device configured by two substrates (the first substrate 400 and the second substrate 200) as in the above-described first embodiment.

5. Modification Example 2

Figure 12:
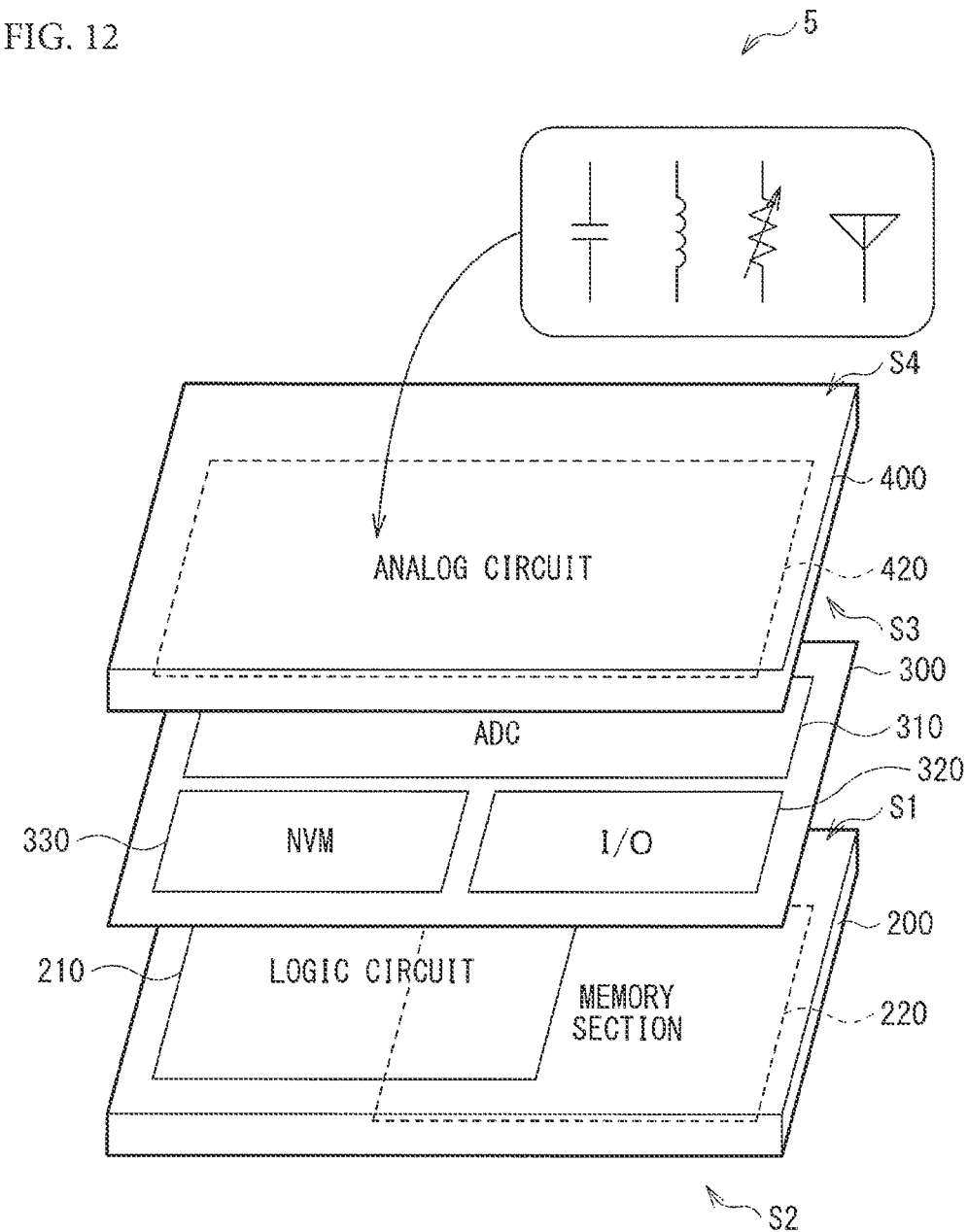
FIG. 12 is a schematic view of a semiconductor device according to Modification Example 2 of the present disclosure.
Figure 13:
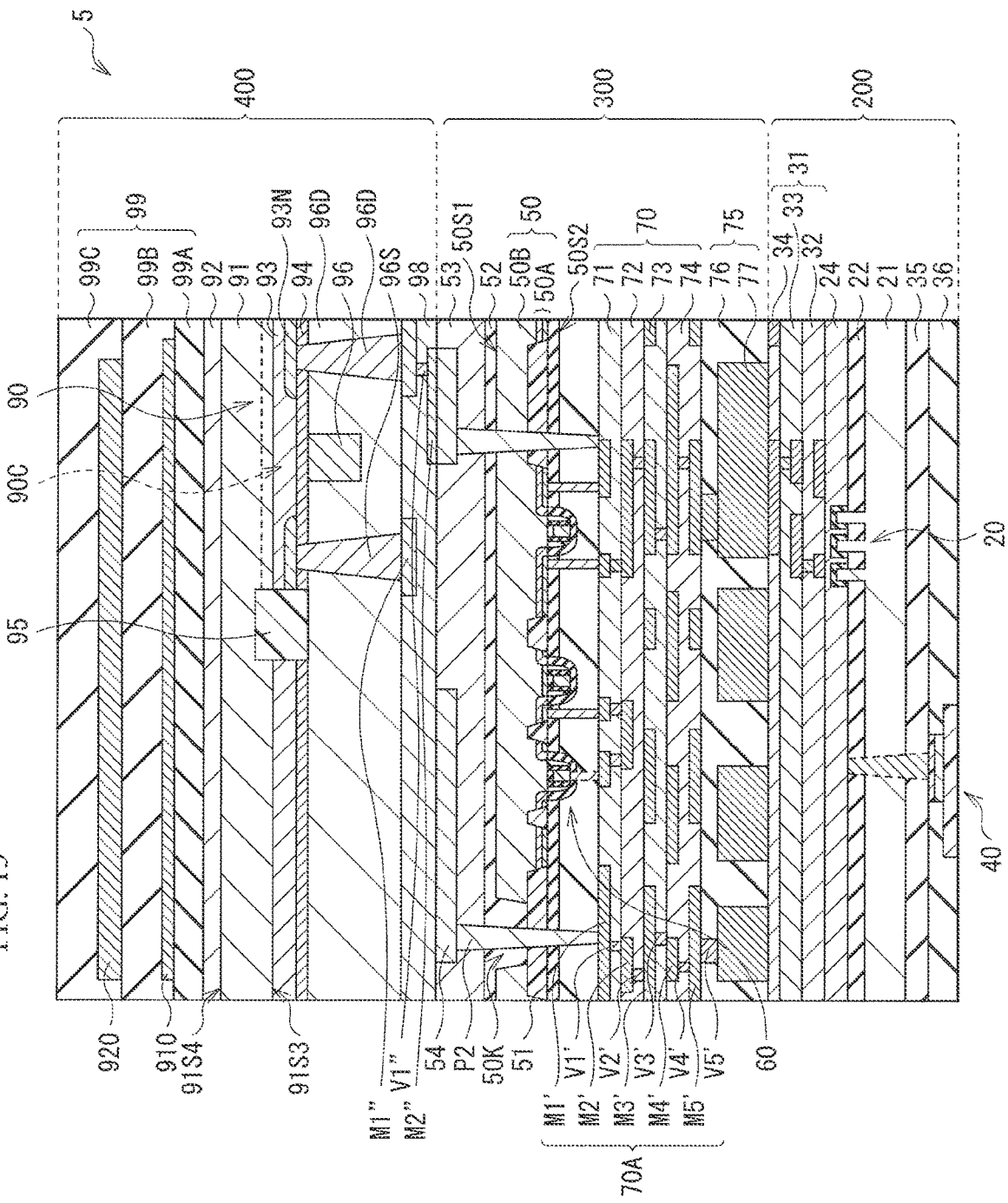
FIG. 13 is a cross sectional view of a specific configuration of the semiconductor device illustrated in FIG. 12.

FIG. 12 illustrates a schematic configuration of a semiconductor device (semiconductor device 5) according to a modification example of the third embodiment of the present disclosure. FIG. 13 illustrates an example of a specific cross-sectional configuration of the semiconductor device 5 illustrated in FIG. 12. In the present modification example, for example, an antenna 920 is provided on side of a surface S4 opposite to the surface S3 of the first substrate 400. Moreover, a shield structure (shield layer 910) is provided between the transistor 90 provided on the surface S3 side of the first substrate 400 and the antenna 920 provided on the surface S4 side.

In the present modification example, the shield layer 910 is provided on the Si substrate 92 that is a base substrate of the surface 91S4 of the GaN substrate 91, with an insulating layer 99A interposed therebetween. The antenna 920 is disposed on the shield layer 910 with the insulating layer 99B interposed therebetween. As a material of the shield layer 910, it is preferable to use, for example, a magnetic material having a very small magnetic anisotropy and high initial permeability examples thereof include a permalloy material. An insulating layer 99C is provided around the antenna 920.

The antenna 920 is electrically coupled to the transmit-receive switch provided, for example, at the RF front-end section by means of the contact plug penetrating the GaN substrate 91, for example, though not illustrated in FIG. 13. The RF front-end section is provided on the surface S3 side of the first substrate 400, for example. The type of the antenna 920 is not particularly limited: examples thereof include a linear antenna such as a monopole antenna or a dipole antenna, and a planar antenna such as a microstrip antenna including a Low-K film interposed between metal films.

As described above, in the present modification example, the antenna 920 is provided on the surface S4 of the first substrate 400, thus making it possible to dispose, for example, the RF front-end section configuring the platform for communication provided on the surface S3 and the antenna 920 at the shortest distance and couple them together. This makes it possible to perform a desired signal processing without attenuating signal intensity.

Moreover, providing the antenna 920 on a surface different from surfaces where various circuits such as the RF front-end section are provided increases design freedom, thus allowing for formation of the antenna 920 using suitable film thickness, size, or material. Accordingly, it is possible to improve element characteristics of the antenna 920.

It is to be noted that, in addition to the antenna 920, a capacitor, a coil, a resistor, or the like may be provided on the surface S4 side of the first substrate 400, as illustrated in FIG. 12.

Although the present disclosure has been described hereinabove with reference to the first to third embodiments and Modification Examples 1 and 2, the present disclosure is not limited to the above-described embodiments, etc., and may be modified in a variety of ways. For example, although the above-described embodiments, etc. have been described with reference to specific configurations of the transistors 20 and 60, the storage element 40, and the like, there is no need to provide all of the components, and other components may be further provided.

Moreover, although the above-described embodiments, etc. have been described with reference to the semiconductor device including two or three substrates laminated together, four or more substrates may be laminated.

It is to be noted that the effects described in the present specification are merely exemplary and non-limiting, and other effects may be included.

Moreover, the semiconductor device of the present disclosure and the method of manufacturing the semiconductor device may have the following configurations.

(1)
A semiconductor device including:
a first substrate provided with an active element: and
a second substrate laminated with the first substrate and electrically coupled to the first substrate,
the second substrate being provided with a first transistor configuring a logic circuit on a first surface and with a non-volatile memory element on a second surface opposite to the first surface.

(2)
The semiconductor device according to (1), in which
the first transistor is provided on a surface, of the second substrate, facing the first substrate, and
the non-volatile memory element is provided on side opposite to the surface facing the first substrate.

(3)
The semiconductor device according to (1) or (2), further including a third substrate provided between the first substrate and the second substrate, the third substrate being provided with a second transistor that is driven at a drive voltage higher than a drive voltage of the first transistor.

(4)
The semiconductor device according to (3), in which the third substrate is provided with an analog circuit including the second transistor.

(5)
The semiconductor device according to any one of (1) to (4), in which the second substrate is provided with a leading electrode on the second surface.

(6)
The semiconductor device according to any one of (1) to (5), in which the non-volatile memory element includes a magnetic tunnel junction element.

(7)
The semiconductor device according to any one of (1) to (6), in which the active element includes an imaging element.

(8)
The semiconductor device according to any one of (1) to (7), in which the active element includes a circuit having a communication function.

(9)
The semiconductor device according to (8), in which
the first substrate includes the circuit having the communication function on a third surface facing the second substrate, and
the first substrate is provided with an antenna on a fourth surface opposite to the third surface.

(10)
The semiconductor device according to (9), further including a shield structure provided between the circuit having the communication function and the antenna.

(11)
The semiconductor device according to any one of (1) to (10), in which
the first substrate includes a core substrate, and
the core substrate includes a compound semiconductor substrate.

(12)
A method of manufacturing a semiconductor device, the method including:
forming an active element on a first substrate;
forming a transistor configuring a logic circuit on a first surface of a second substrate;
electrically coupling the first substrate and the second substrate together; and
forming a non-volatile memory element on a second surface, of the second substrate, opposite to the first surface.

(13)
The method of manufacturing the semiconductor device according to (12), the method further including:
joining the first substrate including the active element and the second substrate provided with the transistor to each other, with the first surface of the second substrate as a facing surface, and
thereafter forming the non-volatile memory element on the second surface of the second substrate.

(14)
The method of manufacturing the semiconductor device according to (13), the method further including forming a leading electrode on the second surface of the second substrate with an insulating layer interposed therebetween after the forming of the non-volatile memory element on the second surface.

(15)
The method of manufacturing the semiconductor device according to (14), in which the forming of the leading electrode includes forming the leading electrode at a temperature for forming the non-volatile memory element or lower.

This application claims the benefit of Japanese Priority Patent Application JP2017-020626 filed with the Japanese Patent Office on Feb. 7, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device, comprising:
a first substrate including an active element;
a second substrate including:
a first surface;
a second surface;
a first transistor including:
   a fin and
   a gate insulating film provided to cover side surfaces and an upper surface of the fin,
wherein the first transistor configures a logic circuit provided on the first surface that controls operations of the active element; and
a non-volatile memory provided on the second surface opposite to the first surface,
wherein the second substrate is laminated with the first substrate and electrically coupled to the first substrate; and
a contact plug,
wherein the first transistor and the non-volatile memory are coupled together via the contact plug,
wherein the contact plug has a truncated pyramid shape with an occupied area of the truncated pyramid shape increasing from the first surface towards the second surface,
wherein the contact plug is provided between the first surface and the second surface of the second substrate without overlapping with the gate insulating film of the first transistor in a plan view along a length of the contact plug, and
wherein the contact plug electrically connects the first transistor and the non-volatile memory together.

2. The semiconductor device according to claim 1, wherein
the first transistor is provided on a surface of the second substrate facing the first substrate, and
the non-volatile memory element is provided on a side opposite to the surface facing the first substrate.

3. The semiconductor device according to claim 1, further comprising a third substrate provided between the first substrate and the second substrate, the third substrate being provided with a second transistor that is driven at a drive voltage higher than a drive voltage of the first transistor.

4. The semiconductor device according to claim 3, wherein the third substrate is provided with an analog circuit including the second transistor.

5. The semiconductor device according to claim 1, wherein the second substrate is provided with a leading electrode on the second surface.

6. The semiconductor device according to claim 1, wherein the non-volatile memory element comprises a magnetic tunnel junction element.

7. The semiconductor device according to claim 1, wherein the active element comprises an imaging element.

8. The semiconductor device according to claim 1, wherein the active element comprises a circuit having a communication function.

9. The semiconductor device according to claim 8, wherein
the first substrate includes the circuit having the communication function on a third surface facing the second substrate, and
the first substrate is provided with an antenna on a fourth surface opposite to the third surface.

10. The semiconductor device according to claim 9, further comprising a shield structure provided between the circuit having the communication function and the antenna.

11. The semiconductor device according to claim 1, wherein
the first substrate includes a core substrate, and
the core substrate comprises a compound semiconductor substrate.

12. A method of manufacturing a semiconductor device, the method comprising:
providing a first substrate;
forming an active element on the first substrate;
providing a second substrate including a first surface and a second surface;
forming a transistor including a fin and a gate insulating film provided to cover side surfaces and an upper surface of the fin,
wherein the first transistor configures a logic circuit on the first surface of the second substrate that controls operations of the active element;
electrically coupling the first substrate and the second substrate together;
providing a contact plug; and
forming a non-volatile memory element on the second surface of the second substrate opposite to the first surface,
wherein the transistor and the non-volatile memory are coupled together via the contact plug,
wherein the contact plug has a truncated pyramid shape with an occupied area of the truncated pyramid shape increasing from the first surface towards the second surface,
wherein the contact plug is provided between the first surface and the second surface of the second substrate without overlapping with the gate insulating film of the first transistor in a plan view along a length of the contact plug, and
wherein the contact plug electrically connects the transistor and the non-volatile memory together.

13. The method of manufacturing the semiconductor device according to claim 12, the method further comprising:
joining the first substrate including the active element and the second substrate provided with the transistor to each other, with the first surface of the second substrate as a facing surface, and
thereafter forming the non-volatile memory element on the second surface of the second substrate.

14. The method of manufacturing the semiconductor device according to claim 13, the method further comprising forming a leading electrode on the second surface of the second substrate with an insulating layer interposed therebetween after the forming of the non-volatile memory element on the second surface.

15. The method of manufacturing the semiconductor device according to claim 14, wherein the forming of the leading electrode includes forming the leading electrode at a temperature for forming the non-volatile memory element or lower.

16. The semiconductor device according to claim 1, wherein the second substrate further comprises a multilayer wiring section provided above the first transistor for electrically coupling the first substrate to the second substrate.

17. The semiconductor device according to claim 1, wherein the first transistor comprises a fin field-effect transistor (FET).

18. The method of manufacturing the semiconductor device according to claim 12, wherein the forming of the non-volatile memory element includes forming the non-volatile memory element using a magnetic tunnel junction element.

19. The method of manufacturing the semiconductor device according to claim 12, the method further comprising forming a multilayer wiring section provided above the transistor for electrically coupling the first substrate to the second substrate.

20. The method of manufacturing the semiconductor device according to claim 12, wherein the forming of the transistor includes forming the transistor using a fin field-effect transistor (FET).

* * * * *